United States Patent
Mishima et al.

(10) Patent No.: US 11,758,749 B2
(45) Date of Patent: Sep. 12, 2023

(54) ORGANIC EL ELEMENT HAVING ONE FUNCTIONAL LAYER WITH NAF AND THE OTHER FUNCTIONAL LAYER WITH YB

(71) Applicant: JOLED Inc., Tokyo (JP)

(72) Inventors: Kosuke Mishima, Tokyo (JP); Koyo Sakamoto, Tokyo (JP); Muneharu Sato, Tokyo (JP)

(73) Assignee: JOLED INC., Tokyo (JP)

(*) Notice: Subject to any disclaimer, the term of this patent is extended or adjusted under 35 U.S.C. 154(b) by 74 days.

(21) Appl. No.: 17/372,520

(22) Filed: Jul. 12, 2021

(65) Prior Publication Data

US 2021/0343968 A1    Nov. 4, 2021

Related U.S. Application Data

(62) Division of application No. 16/662,066, filed on Oct. 24, 2019, now abandoned.

(30) Foreign Application Priority Data

Oct. 26, 2018 (JP) .................................. 2018-201837

(51) Int. Cl.
*H10K 50/17* (2023.01)
*H10K 50/818* (2023.01)
(Continued)

(52) U.S. Cl.
CPC ......... *H10K 50/171* (2023.02); *H10K 50/818* (2023.02); *H10K 50/828* (2023.02);
(Continued)

(58) Field of Classification Search
CPC .......................... H01L 51/5092; H01L 27/3211
See application file for complete search history.

(56) References Cited

U.S. PATENT DOCUMENTS

| 6,013,384 A | 1/2000 | Kido et al. |
| 2007/0020483 A1 | 1/2007 | Park et al. |

(Continued)

FOREIGN PATENT DOCUMENTS

| JP | 10-270171 A | 10/1998 |
| JP | 2006-74023 A | 3/2006 |

(Continued)

*Primary Examiner* — Jay C Chang
*Assistant Examiner* — Mikka Liu
(74) *Attorney, Agent, or Firm* — XSENSUS LLP

(57) ABSTRACT

An organic electroluminescence element includes an anode, an organic light emitting layer disposed on an upper side of the anode, a first functional layer disposed over the organic light emitting layer and including NaF, a second functional layer disposed over the first functional layer and including an organic material containing Yb, and a cathode disposed on an upper side of the second functional layer. A method of manufacturing an organic electroluminescence element, includes forming an anode, forming an organic light emitting layer on an upper side of the anode, forming a first functional layer including NaF over the organic light emitting layer, forming a second functional layer including an organic material containing Yb over the first functional layer, and forming a cathode on an upper side of the second functional layer.

13 Claims, 19 Drawing Sheets

(51) Int. Cl.
  *H10K 50/828* (2023.01)
  *H10K 59/35* (2023.01)
  *H10K 71/00* (2023.01)
  *H10K 102/00* (2023.01)

(52) U.S. Cl.
  CPC ............. *H10K 59/35* (2023.02); *H10K 71/00* (2023.02); *H10K 2102/351* (2023.02)

(56) References Cited

U.S. PATENT DOCUMENTS

| | | |
|---|---|---|
| 2007/0090376 A1 | 4/2007 | Kumaki et al. |
| 2007/0090756 A1 | 4/2007 | Okada et al. |
| 2009/0096357 A1 | 4/2009 | Lee et al. |
| 2010/0096622 A1 | 4/2010 | Iizumi et al. |
| 2010/0301741 A1 | 12/2010 | Kim et al. |
| 2011/0073846 A1 | 3/2011 | Nakajima et al. |
| 2011/0169045 A1 | 7/2011 | Oyamada et al. |
| 2012/0248418 A1* | 10/2012 | Kim .................. H01L 51/5231 257/40 |
| 2014/0151681 A1 | 6/2014 | Iwasaki |
| 2014/0320945 A1* | 10/2014 | Chen ....................... G02F 1/153 359/274 |
| 2015/0144897 A1* | 5/2015 | Kang ................... H01L 51/5221 257/40 |
| 2015/0318507 A1 | 11/2015 | Song et al. |
| 2017/0154927 A1* | 6/2017 | Jo ......................... H01L 27/288 |
| 2017/0331068 A1 | 11/2017 | Kim et al. |
| 2019/0131558 A1 | 5/2019 | Mishima |
| 2020/0136078 A1 | 4/2020 | Mishima et al. |

FOREIGN PATENT DOCUMENTS

| | | |
|---|---|---|
| JP | 2007-36175 A | 2/2007 |
| JP | 2007-134677 A | 5/2007 |
| JP | 2009-94456 A | 4/2009 |
| JP | 2010-278003 A | 12/2010 |
| JP | 2012-238913 A | 12/2012 |
| JP | 2013-33872 A | 2/2013 |
| JP | 2019-80027 A | 5/2019 |
| JP | S633716 B1 | 1/2020 |
| WO | 2010/016101 A1 | 2/2010 |

* cited by examiner

FIG. 10

(COMPARISON TABLE)

| | FIRST FUNCTIONAL LAYER | SECOND FUNCTIONAL LAYER DOPING METAL | LUMINOUS EFFICIENCY | DRIVING VOLTAGE (RECIPROCAL) | LIFE | TOTAL EVALUATION |
|---|---|---|---|---|---|---|
| COMPARATIVE EXAMPLE PRODUCT 1 | ABSENT | Ba | 61 | 72 | 33 | C |
| COMPARATIVE EXAMPLE PRODUCT 2 | ABSENT | Yb | 64 | 74 | 51 | C |
| COMPARATIVE EXAMPLE PRODUCT 3 | NaF | Ba | 95 | 97 | 70 | C |
| WORKING EXAMPLE PRODUCT | NaF | Yb | 100 | 100 | 100 | A |

ORGANIC EL ELEMENT HAVING ONE FUNCTIONAL LAYER WITH NAF AND THE OTHER FUNCTIONAL LAYER WITH YB

CROSS-REFERENCE TO RELATED APPLICATIONS

The present application is a Divisional of Ser. No. 16/662,066, filed Oct. 24, 2019, which claims priority to JP 2018-201837 filed on Oct. 26, 2018, the entire contents of each are hereby incorporated by reference.

BACKGROUND

The present disclosure relates to an organic electroluminescence element (hereinafter referred to as "organic EL element"), a method of manufacturing the same, an organic EL panel in which the organic EL elements are arranged in a matrix pattern over a substrate, an organic EL display device using the organic EL panel as an image display section, and an electronic apparatus.

In recent years, as a light emission type display, an organic EL panel in which a plurality of organic EL elements are arranged along column and row directions (in a matrix pattern) over a substrate has been put to practical use as a display of electronic apparatuses. Each organic EL element is a current driving type light emitting element having a basic structure in which an organic light emitting layer including an organic light emitting material is disposed between a pair of electrodes consisting of an anode and a cathode. At the time of driving, a voltage is impressed between the pair of electrodes, and light is generated attendant on recombination between holes injected from the anode into the organic light emitting layer and electrons injected from the cathode into the organic light emitting layer.

Normally, in such an organic EL panel, an electron transport layer is provided between the cathode and the organic light emitting layer for enhancing injectability of electrons from the cathode into the organic light emitting layer. As the electron transport layer, for example, JP 2009-94456A (hereinafter referred to as Patent Document 1) discloses a configuration in which a compound of an alkali metal or an alkaline metal (hereinafter referred to as "alkali metal or the like") is contained in an organic layer.

Such an alkali metal or the like is low in work function, and is high in the ability to inject or transport electrons from the cathode; therefore, the alkali metal or the like can enhance luminous efficiency of the organic EL element.

In addition, in Patent Document 1, a buffer layer is provided between the electron transport layer and the organic light emitting layer in such a manner as to prevent a situation in which the alkali metal or the like in the electron transport layer might be dispersed into the organic light emitting layer due to high temperature, to deteriorate light emission characteristics. The buffer layer is formed using an organic compound such as Alq3, 4,4'-N,N'-dicarbozole-biphenyl (CBP), distyrylarylene (DSA), DPB, BAlq, or anthracene derivative compound Ir.

SUMMARY

Incidentally, the organic light emitting layer and the like organic layers have a physical property that moisture is easily absorbed therein or permeated therethrough. On the other hand, the alkali metal or the like contained in the electron transport layer is high in activity, and has a problem that it immediately reacts with moisture contained in the organic layer, to be altered in quality, leading to deterioration of electron injection characteristics and shortening of the life of the organic EL panel.

Particularly, recently, a wet process in which a solution containing an organic material for forming an organic layer and a solvent (the solution hereinafter referred to simply as "ink") is applied by a printing device to form the desired organic layer has often been used, from its advantage on a manufacturing cost basis. In this case, the amount of moisture remaining in the organic layer is conspicuously larger as compared to the case where the desired film is formed by a dry process such as a vapor deposition method. In the configuration of Patent Document 1, the buffer layer is formed using an organic compound, so that the moisture in the organic layer on the lower side may penetrate through the buffer layer into the electron transport layer, to react with the alkali metal or the like in the electron transport layer, thereby deteriorating light emission characteristics.

Thus, there is a need for an organic EL element capable of securing a good luminous efficiency and a prolonged life while reducing the manufacturing cost by forming at least one organic layer by a wet process, a method of manufacturing the same, an organic EL panel in which the organic EL elements are arranged in a matrix pattern over a substrate, an organic EL display device using the organic EL panel as an image display section, and an electronic apparatus.

According to one mode of the present disclosure, there is provided an organic EL element including an anode, an organic light emitting layer disposed on an upper side of the anode, a first functional layer disposed over the organic light emitting layer and including NaF, a second functional layer disposed over the first functional layer and including an organic material containing Yb, and, a cathode disposed on an upper side of the second functional layer.

In addition, according to another mode of the present disclosure, there is provided an organic EL display device including the above-mentioned organic EL panel, and a driving section driving the organic EL panel to display an image.

Besides, according to a further mode of the present disclosure, there is provided an electronic apparatus including the above-mentioned organic EL display device as an image display section.

In addition, according to yet another mode of the present disclosure, there is provided a method of manufacturing an organic EL element, including forming an anode, forming an organic light emitting layer on an upper side of the anode, forming a first functional layer including NaF over the organic light emitting layer, forming a second functional layer including an organic material containing Yb over the first functional layer, and forming a cathode on an upper side of the second functional layer.

In accordance with the organic EL element and the method of manufacturing an organic EL element according to the above modes of the present disclosure, it is possible to provide an organic EL element, an organic EL panel, an organic EL display device and an electronic apparatus which are capable of securing a good luminous efficiency and a prolonged life while reducing the manufacturing cost by forming at least one organic layer by a wet process.

BRIEF DESCRIPTION OF THE DRAWINGS

FIG. 10 is a table depicting the results of a comparative experiment for verifying the effect of the organic EL element according to the mode of the present disclosure;

DETAILED DESCRIPTION OF THE PREFERRED EMBODIMENT

Figure 1:
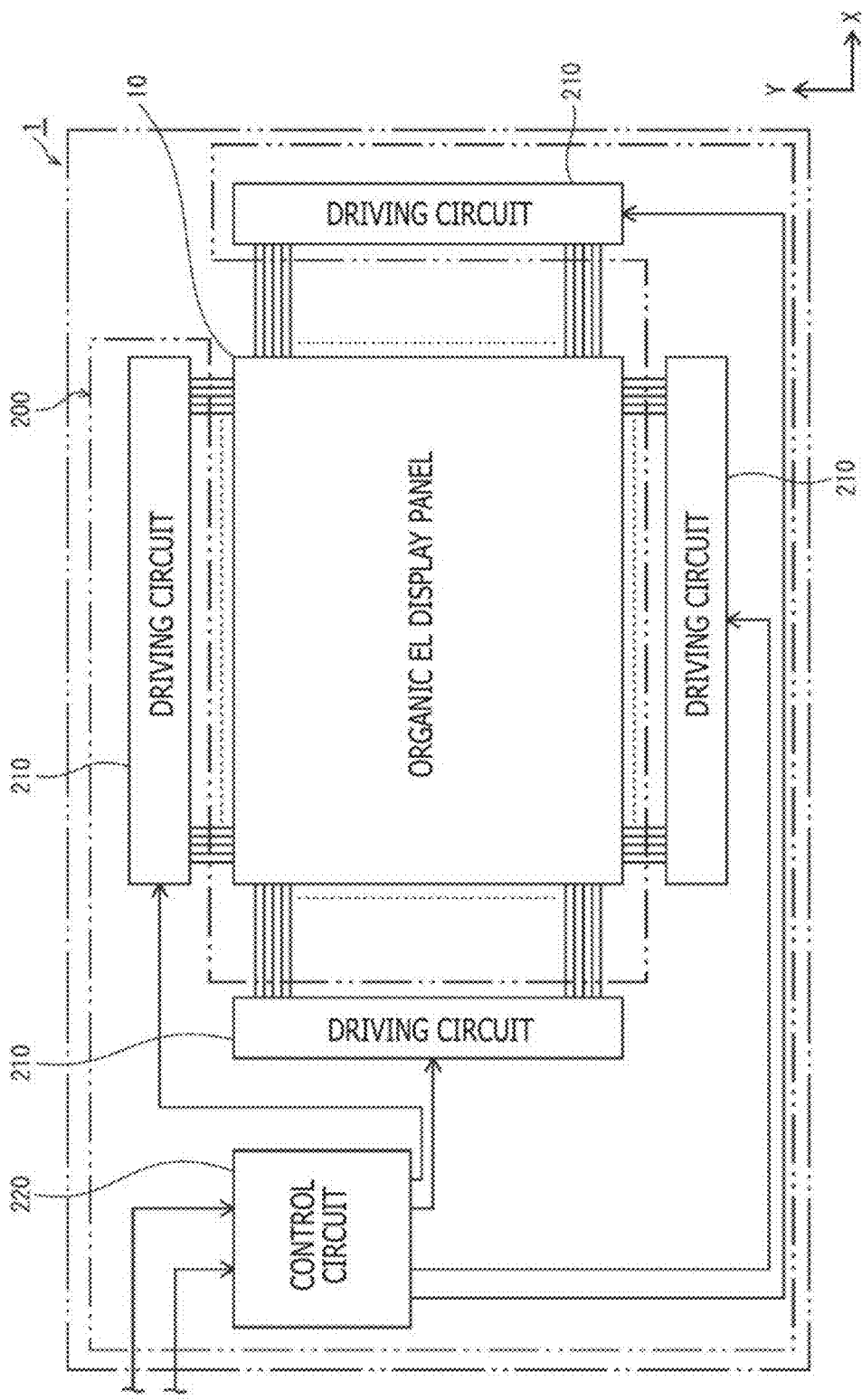
FIG. 1 is a block diagram depicting the general configuration of an organic EL display device according to a mode of the present disclosure.

<<How One Mode of the Present Disclosure has been Reached>>

Each organic layer in an organic EL panel has often been formed by a dry process such as vacuum deposition in the related art. However, attendant on the progress of coating (applying) technology, particularly the technology of printing device, in recent years, a technology of forming each organic layer by a wet process has been spreading.

The wet process is a process in which an ink prepared by dissolving an organic material in an organic solvent is printed onto predetermined parts by a printing device or the like, followed by drying to form an organic layer. The wet process is advantageous on a cost basis, since equipment cost can be suppressed even in the case of manufacturing a large-sized organic EL panel, and material use efficiency is high.

Particularly, in the case of forming organic light emitting layers by a printing process, pixels are partitioned by partition walls for preventing the inks for the adjacent pixels from mixing with one another, and the partition walls are also formed by a wet process using a resin material, whereby a cost-basis advantage is realized.

As described also in Patent Document 1, for facilitating movement of electrons into the organic light emitting layer, an electron transport layer may be formed between the cathode and the organic light emitting layer by use of an organic material doped with an alkali metal or the like having a low work function, whereby a good carrier balance is maintained, and luminous efficiency of the organic light emitting layer is optimized.

However, the alkali metal or the like is high in activity, and has a problem that when moisture, if little, is contained in the resin material of the partition walls and the organic light emitting layers as aforementioned, the moisture soon penetrates into the electron injection layer, so that the alkali metal or the like in the electron transport layer reacts with the moisture, to be altered in quality, possibly resulting in conspicuous deterioration of the electron injecting property. It was found that due to this problem, luminous efficiency may be worsened and life may be shortened.

In Patent Document 1, the buffer layer including Alq3, 4,4'-N,N'-dicarbazole-biphenyl (CBP) or the like is provided between the electron transport layer and the organic light emitting layer; however, since the buffer layer includes an organic material, it does not function sufficiently from the viewpoint of restraining penetration of moisture into the electron transport layer.

In addition, recently, for speedily and uniformly applying inks for forming the organic light emitting layers, there may be used a method in which the pixels arranged in a line form are partitioned by banks on a column basis and the inks are applied in a belt form (line bank system). In this case, it is considered that the area of contact between the organic light emitting layer and the underlying organic layer is enlarged, and moisture in the underlying organic layer moves into the electron transport layer, thereby further deteriorating the characteristics of the electron transport layer.

In view of the foregoing, the inventors of the present application made extensive and intensive investigations in search of a configuration capable of securing a good luminous efficiency and a prolonged life, even in the case of adopting the line bank system, while realizing a reduction in cost by adopting a wet process. As a result of their investigations, one mode of the present disclosure has been reached.

<<Outline of One Mode of the Present Disclosure>>

According to one mode of the present disclosure, there is provided an organic EL element including: an anode; an organic light emitting layer disposed on an upper side of the anode; a first functional layer disposed over the organic light emitting layer and including NaF; a second functional layer disposed over the first functional layer and including an organic material containing Yb; and a cathode disposed on an upper side of the second functional layer.

By such a mode, it is possible to enhance the luminous efficiency of an organic EL element and realize a prolonged life while reducing the manufacturing cost by forming at least one organic layer by a wet process.

According to another mode of the present disclosure, there is provided the organic EL element of the above mode in which the first functional layer has a film thickness of 0.1 to 20 nm.

By such a mode, it is possible, while exhibiting a waterproof property as to NaF in the first functional layer, to partly reduce NaF by the second functional layer disposed over the first functional layer and including an organic material containing Yb, thereby securing an electron injecting property, and to obtain an organic EL element having a good luminous efficiency and free of shortening of life.

According to a further mode of the present disclosure, there is provided the organic EL element of the above mode in which the second functional layer has a film thickness of 5 to 150 nm.

By such a mode, it is possible, while exhibiting a waterproof property as to NaF in the first functional layer, to reduce the first functional layer (NaF), and to exhibit an electron-injecting effect of Yb contained in the second functional layer. In addition, it is possible to alleviate sputter damage when, for example, a film of ITO (indium tin oxide) or IZO (indium zinc oxide) is formed by a sputtering method as a third functional layer over the second functional layer, and to obtain an organic EL element having a good luminous efficiency and free of shortening of life.

According to yet another mode of the present disclosure, there is provided the organic EL element of the above mode in which the second functional layer includes a first layer section disposed over the first functional layer, and a second layer section disposed over the first layer section, and Yb content of the second layer section is greater than Yb content of the first layer section.

According to a yet further mode of the present disclosure, there is provided the organic EL element of the above mode in which the second functional layer includes a first layer section, a second layer section and a third layer section that are sequentially stacked in this order from the first functional layer side, and a relation of $X2<X1 \leq X3$ is satisfied, where $X1$, $X2$ and $X3$ are Yb contents of the first layer section, the second layer section and the third layer section, respectively.

With the Yb concentration varied in the film thickness direction of the second functional layer in this manner, it is possible, while exhibiting a water-proof property as to NaF in the first functional layer, to suitably reduce NaF, thereby to enhance electron injecting property into the light emitting layer, and to prevent light transmittance from being lowered more than necessary due to an increase in Yb doping amount. Besides, with the concentration of Yb in the third layer section raised, it is possible to enhance electron injecting property from the cathode side into the second functional layer, to inhibit penetration of moisture from the exterior, and to further prolong the life of the organic EL element.

According to still another mode of the present disclosure, there is provided the organic EL element of the above mode in which Yb content of the second functional layer increases continuously in going from the first functional layer toward the cathode.

With the Yb content of the second functional layer varied continuously in this manner, it is possible, while exhibiting a water-proof property as to NaF in the first functional layer, to cause a weak reducing property to act on the first functional layer, to restrain penetration of moisture into the second functional layer more assuredly, even though limiting electron injecting property, and to prevent light transmittance from being lowered more than necessary due to an increase in Yb doping amount. In addition, with the concentration of Yb enhanced on the cathode side, it is possible to enhance electron injecting property from the cathode side into the second functional layer, to inhibit penetration of moisture from the exterior, and to further prolong the life of the organic EL element.

According to a still further mode of the present disclosure, there is provided the organic EL element of the above mode in which a transparent conductive film is formed as a third functional layer between the second functional layer and the cathode.

According to another mode of the present disclosure, there is provided the organic EL element of the above mode in which the third functional layer has a film thickness of not less than 15 nm.

By such a mode, it is possible, by adjusting the film thickness of the third functional layer, to build up an optical resonator structure according to the wavelength of the color in which light is emitted.

According to a further mode of the present disclosure, there is provided the organic EL element of the above mode in which a thin film including Yb and having a thickness of 0.1 to 3 nm is formed between the second functional layer and the third functional layer.

According to yet another mode of the present disclosure, there is provided the organic EL element of the above mode in which a thin film including Yb and having a thickness of 0.1 to 3 nm is formed between the third functional layer and the cathode.

According to a yet further mode of the present disclosure, there is provided the organic EL element of the above mode in which a thin film including Yb and having a thickness of 0.1 to 5 nm is formed on an opposite side of the cathode from the organic light emitting layer.

By such a mode, it is possible not only to enhance film quality of the cathode, but also to inhibit penetration of moisture from the exterior and thereby to further prolong the life of the organic EL element.

According to still another mode of the present disclosure, there is provided the organic EL element of the above mode in which the anode has a light reflecting property, and the cathode has a semi-transparent property.

Here, according to a still further mode of the present disclosure, there is provided the organic EL element of the above mode in which light emitted from the organic light emitting layer includes a first light flux going out directly from the cathode and a second light flux going out from the cathode after being reflected by respective surfaces on the organic light emitting layer side of the anode and the cathode, and a film thickness of at least one functional layer interposed in a range from the organic light emitting layer to the cathode is set according to a wavelength of a color in which the light is emitted in such a manner that the first light flux and the second light flux resonate.

By such a mode, it is possible to build up an optical resonator configured between an interface of the anode and an interface of the cathode, and to further enhance luminous efficiency of the organic EL element.

According to another mode of the present disclosure, there is provided an organic EL panel in which a plurality of the organic EL elements according to the above mode are arranged in a matrix pattern on an upper side of a substrate, and the organic light emitting layers in at least the organic EL elements adjacent to each other in a row direction are partitioned from each other by a partition wall extending in a column direction.

This makes it possible to provide an organic EL panel that is excellent in luminous efficiency and can be prolonged in life.

An organic EL panel according to a further mode of the present disclosure is of a top emission type.

In a top emission type organic EL panel, a driving circuit including a TFT (thin film transistor) or the like is not disposed in the direction in which light goes out; therefore, numerical aperture of each organic EL element can be enlarged, and the organic EL panel is excellent in luminous efficiency.

An organic EL display device according to yet another mode of the present disclosure includes the organic EL panel according to the above-mentioned mode, and a driving section driving the organic EL panel to display an image.

An electronic apparatus according to a yet further mode of the present disclosure includes the above-mentioned organic EL display device as an image display section in the above-mentioned mode.

Such an organic EL display device and such an electronic apparatus are excellent in luminous efficiency of a display panel, and are capable of realizing a prolonged life.

According to a further mode of the present disclosure, there is provided a method of manufacturing an organic EL element, the method including a first step of forming an anode; a second step of forming an organic light emitting layer on an upper side of the anode; a third step of forming a first functional layer including NaF over the organic light emitting layer; a fourth step of forming a second functional layer including an organic material containing Yb over the first functional layer; and a fifth step of forming a cathode on an upper side of the second functional layer.

By such a mode, it is possible to manufacture an organic EL element excellent in luminous efficiency and capable of displaying a high-quality image as aforementioned.

According to yet another mode of the present disclosure, there is provided the method of manufacturing an organic EL element, in which the fourth step includes forming a layer of an organic material over the first functional layer, and thereafter doping the layer of the organic material with Yb to form the second functional layer.

The method of manufacturing an organic EL panel may further include, between the first step and the second step, a hole movement facilitating layer forming step of forming a hole injection layer or a hole transport layer, and at least one of the hole movement facilitating layer forming step, the second step, the third step and the fourth step is carried out by a wet process.

By this, a reduction in manufacturing cost is facilitated.

Note that in the above-mentioned modes of the present disclosure, the term "over" does not refer to the upward direction (vertically upward side) in an absolute space recognition, but is defined by a relative positional relation, based on the order of stacking in a stacked structure of the organic EL element. Specifically, in the organic EL element, the direction which is perpendicular to a main surface of the substrate and which is directed toward the stacked body side from the substrate is made to be an upward direction. In addition, for example, the expression "over the substrate" does not refer to only a region in direct contact with the substrate, but includes also a region on the upper side of the substrate with the stacked body interposed therebetween. Besides, for example, the expression "on an upper side of the substrate" does not refer to only an upper region spaced from the substrate by a gap, but includes also a region over (on) the substrate.

Embodiment

An organic EL element, an organic EL panel and an organic EL display device according to one mode of the present disclosure will be described below referring to the drawings. Note that the drawings include schematic ones, and contraction scales and aspect ratios of members may be different from the actual ones.

1. General Configuration of Organic EL Display Device 1

FIG. 1 is a block diagram depicting the general configuration of an organic EL display device 1. The organic EL display device 1 is a display device for use in, for example, television sets, personal computers, portable terminals, displays for business use (electronic signboards, large-sized screens for commercial facilities) or the like.

The organic EL display device 1 includes an organic EL panel 10, and a driving control section 200 electrically connected thereto.

The organic EL panel 10, in the present embodiment, is a top emission type display panel in which an upper surface is a rectangular image display surface. In the organic EL panel 10, a plurality of organic EL elements (not illustrated) are arranged along the image display surface, and an image is displayed by combining light emission of the organic EL elements. Note that the organic EL panel 10 adopts an active matrix system as an example.

The driving control section 200 includes driving circuits 210 connected to the organic EL panel 10, and a control circuit 220 connected to an external device such as a computer or a reception device such as an antenna. The driving circuit 210 includes a power source circuit that supplies electric power to each organic EL element, a signal circuit that applies a voltage signal for controlling electric power supplied to each organic EL element, a scanning circuit that switches over the part to which to apply the voltage signal on the basis of a predetermined interval, and so on.

The control circuit 220 controls the operation of the driving circuits 210 according to data including image information inputted from the external device or the reception device.

Note that while four driving circuits 210 are arranged in the periphery of the organic EL panel 10 as an example in FIG. 1, the configuration of the driving control section 200 is not limited to this, and the number and positions of the driving circuits 210 can be modified as required. In addition, for explanation hereinafter, as depicted in FIG. 1, the direction along the long sides of the upper surface of the organic EL panel 10 will be an X direction, and the direction along the short sides of the upper surface of the organic EL panel 10 will be a Y direction.

2. Configuration of Organic EL Panel 10

(A) Plan-view Configuration

Figure 2:
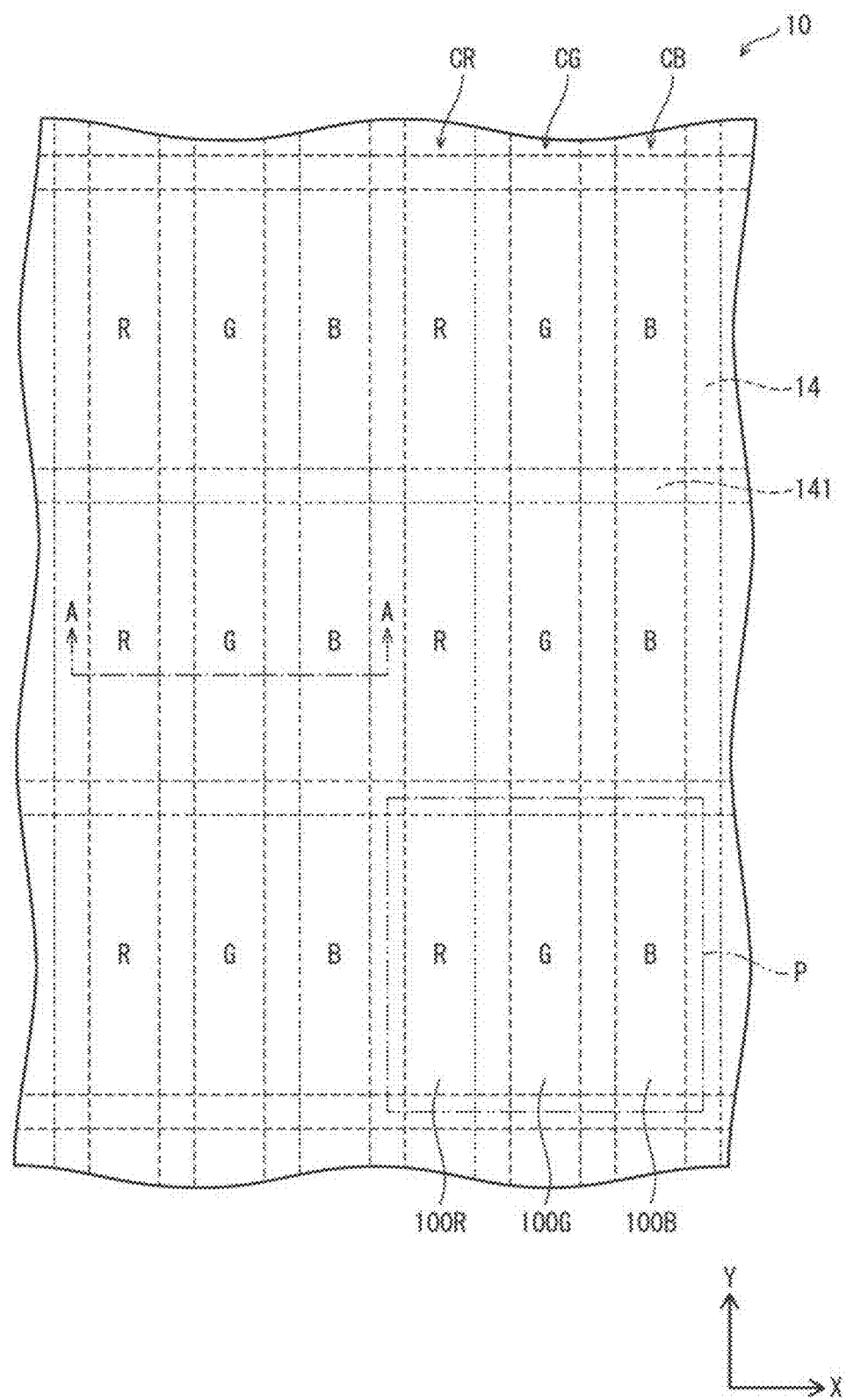
FIG. 2 is a schematic plan view depicting in an enlarged form a part of an image display surface of an organic EL panel in the organic EL display device.

FIG. 2 is a schematic plan view depicting, in an enlarged form, part of the image display surface of the organic EL panel 10. In the organic EL panel 10, as an example, sub-pixels 100R, 100G and 100B that emit light in R (red), G (green) and B (blue) (hereinafter referred also to simply as R, G and B) respectively are arranged in a matrix pattern. The sub-pixels 100R, 100G and 100B are alternately aligned in the X direction, and a set of sub-pixels 100R, 100G and 100B aligned in the X direction constitute one pixel P. In the pixel P, light emission luminances of the sub-pixels 100R, 100G and 100B subjected to gradation control are combined with one another, whereby a full-color expression can be achieved.

In addition, in the Y direction, only one kind of sub-pixels of the sub-pixels 100R, sub-pixels 100G and the sub-pixels 100B are aligned to constitute a sub-pixel column CR, a sub-pixel column CG or a sub-pixel column CB. As a result, in the organic EL panel 10 as a whole, the pixels P are aligned in a matrix pattern along the X direction and the Y direction, and, by combining the color light emissions of the pixels P aligned in the matrix pattern, an image is displayed on the image display surface.

In the sub-pixels 100R, 100G and 100B, organic EL elements 2(R), 2(G) and 2(B) (see FIG. 3) that emit light in colors R, G and B are disposed respectively.

Besides, in the organic EL panel 10 according to the present embodiment, a so-called line bank system is adopted. Specifically, a plurality of partition walls (banks) 14 that partition the sub-pixel columns CR, CG and CB on a column basis are disposed at spacings in the X direction, and, in each of the sub-pixel columns CR, CG and CB, the sub-pixels 100R, 100G and 100B share the organic light emitting layer.

It is to be noted, however, that in each of the sub-pixel columns CR, CG and CB, a plurality of pixel restricting layers 141 that insulate the sub-pixels 100R, 100G and 100B from one another are disposed at spacings in the Y direction, such that each of the sub-pixels 100R, 100G and 100B can emit light independently.

Note that the height of the pixel restricting layers 141 is smaller than the height of a liquid surface when inks for the organic light emitting layers are applied. In FIG. 2, the partition walls 14 and the pixel restricting layers 141 are depicted in dotted lines, since the pixel restricting layers 141 and the partition walls 14 are not exposed to the surface of the image display surface but are disposed inside the image display surface.

(B) Sectional Configuration

Figure 3:
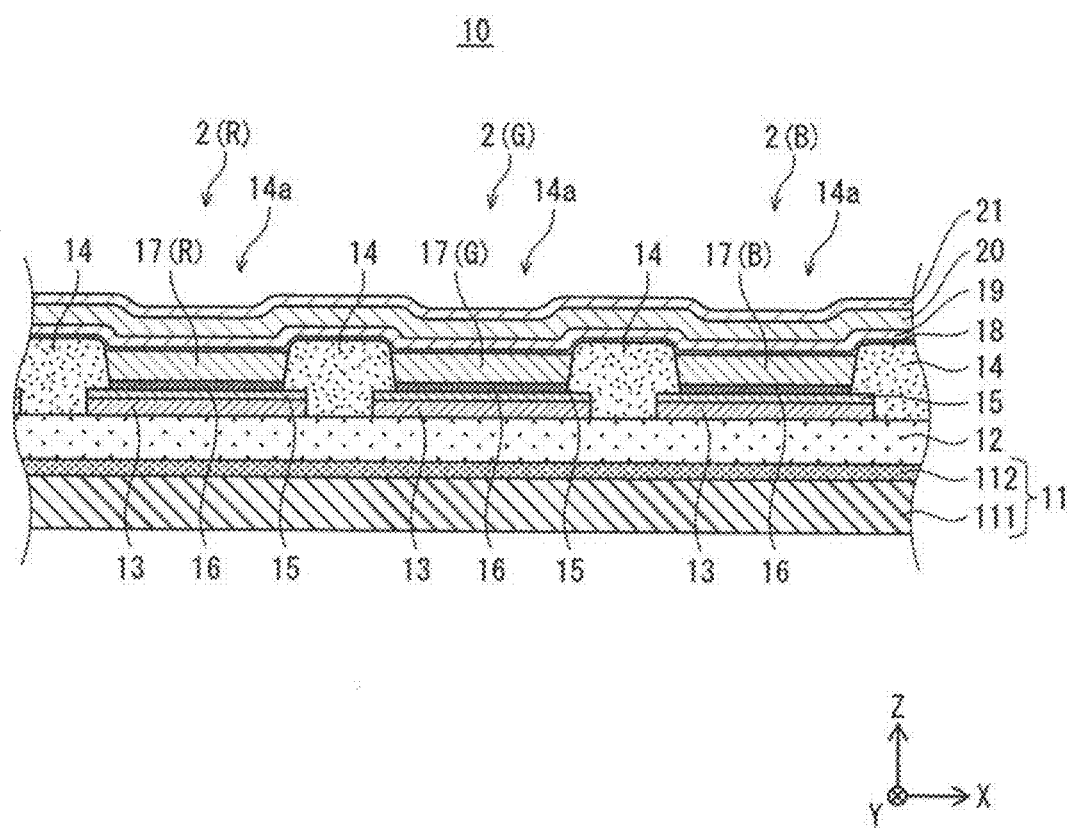
FIG. 3 is a schematic sectional view taken along line A-A of FIG. 2.

FIG. 3 is a schematic sectional view taken along line A-A of FIG. 2.

In the organic EL panel 10, one pixel includes three respective sub-pixels that emit light in R, G and B, and each of the sub-pixels includes the organic EL element 2(R), 2(G) or 2(B) that emit light in the corresponding color.

The organic EL elements 2(R), 2(G) and 2(B) corresponding to the respective light emission colors basically have substantially the same configurations; when they are not discriminated, therefore, they will each be described as the organic EL element 2.

As depicted in FIG. 3, the organic EL element 2 includes a substrate 11, an interlayer insulating layer 12, a pixel electrode (anode) 13, the partition wall 14, a hole injection layer 15, a hole transport layer 16, an organic light emitting layer 17, a first functional layer 18, a second functional layer 19, a counter electrode (cathode) 20, and a sealing layer 21.

The substrate 11, the interlayer insulating layer 12, the first functional layer 18, the second functional layer 19, the counter electrode 20 and the sealing layer 21 are not formed on a pixel basis, but are formed in common for the plurality of organic EL elements 2 possessed by the organic EL panel 10.

(1) Substrate

The substrate 11 includes a base material 111 which is an insulating material, and a TFT layer 112. The TFT layer 112 is formed with driving circuits on a sub-pixel basis. As the base material 111, there can be adopted, for example, glass substrate, quartz substrate, silicon substrate, metallic substrates of molybdenum sulfide, copper, zinc, aluminum, stainless steel, magnesium, iron, nickel, gold, silver and the like, semiconductor substrates of gallium arsenide and the like, and plastic substrates.

As the plastic material, any one of thermoplastic resins and thermosetting resins may be used. Examples of the applicable resin include polyethylene, polypropylene, polyamides, polyimides (PI), polycarbonate, acrylic resins, polyethylene terephthalate (PET), polybutylene terephthalate, polyacetal, other fluororesins, various thermoplastic elastomers based on styrene, polyolefin, polyvinyl chloride, polyurethane, fluororubber, chlorinated polyethylene or the like, epoxy resin, unsaturated polyesters, silicone resins, polyurethane, and copolymers, blends, polymer alloys and the like of them, and stacked bodies of one or more of them.

(2) Interlayer Insulating Layer

The interlayer insulating layer 12 is formed over the substrate 11. The interlayer insulating layer 12 is formed using a resin material, and is for flattening steps present in an upper surface of the TFT layer 112. As the resin material, a positive-type photosensitive material may be mentioned, for example. Examples of such a photosensitive material include acrylic resins, polyimide resins, siloxane resins, and phenolic resins. In addition, though not depicted in the sectional view of FIG. 3, the interlayer insulating layer 12 is formed with contact holes on a sub-pixel basis.

(3) Pixel Electrode

The pixel electrodes 13 each include a metallic layer formed using a light-reflective metallic material, and are formed over the interlayer insulating layer 12. The pixel electrodes 13 are provided on a sub-pixel basis, and are each electrically connected to the TFT layer 112 through the contact hole (not illustrated).

In the present embodiment, the pixel electrode 13 functions as an anode.

Specific examples of the metallic material having a light-reflecting property include Ag (silver), Al (aluminum), aluminum alloys, Mo (molybdenum), APC (an alloy of silver, palladium and copper), ARA (an alloy of silver, rubidium and gold), MoCr (an alloy of molybdenum and chromium), MoW (an alloy of molybdenum and tungsten), and NiCr (an alloy of nickel and chromium).

While the pixel electrode 13 may include a metallic layer alone, it may have a stacked structure in which a layer of a metallic oxide such as ITO or IZO is stacked over a metallic layer.

(4) Partition Wall and Pixel Restricting Layer

The partition walls 14 are for partitioning the plurality of pixel electrodes 13, which are disposed on a sub-pixel basis on the upper side of the substrate 11, from one another on a column basis in the X direction (see FIG. 2), and are in a line bank shape in which they extend in the Y direction between the sub-pixel columns CR, CG and CB aligned in the X direction.

For the partition walls 14, an electrically insulating material is used. Specific examples of the electrically insulating material to be used include insulating organic materials (e.g., acrylic resins, polyimide resins, novolak resins, phenolic resins, etc.).

The partition walls 14 function as structures for preventing color inks, which are applied in the case of forming the organic light emitting layers 17 by a coating (applying) method, from overflowing and mixing with one another.

Note that in the case of using a resin material, it is preferable that the resin material is photosensitive, from the viewpoint of processability. The photosensitive property may be either of the positive type and the negative type.

The partition walls 14 preferably have resistance to organic solvents and heat. In addition, the surfaces of the partition walls 14 preferably have a predetermined liquid repellency, for restraining the inks from flowing out.

At parts where the pixel electrode 13 is not formed, bottom surfaces of the partition walls 14 are in contact with the upper surface of the interlayer insulating layer 12.

The pixel restricting layers 141 are formed using an electrically insulating material, cover end portions of the pixel electrodes 13 adjacent to each other in the Y direction (FIG. 2) in each sub-pixel column, and partition the pixel electrodes 13 adjacent to each other in the Y direction from one another.

The film thickness of the pixel restricting layers 141 is set to be slightly greater than the film thickness of the pixel electrodes 13 but be smaller than the thickness to the upper surface of the organic light emitting layers 17. This ensures that the organic light emitting layers 17 in the sub-pixel columns CR, CG and CB are not partitioned by the pixel restricting layers 141, so that flow of inks at the time of forming the organic light emitting layers 17 is not obstructed. Therefore, it is made easy to uniformize the thickness of the organic light emitting layer 17 in each of the sub-pixel columns.

The pixel restricting layers 141, with the above-mentioned structure, play the roles of restraining step-cut of the organic light emitting layer 17 in each of the sub-pixel columns CR, CG and CB, enhancing the electrical insulation between the pixel electrodes 13 and the counter electrode 20, and the like while enhancing the electrical insulation between the pixel electrodes 13 adjacent to each other in the Y direction.

Specific examples of the electrical insulating material to be used for the pixel restricting layers 141 include the resin materials and inorganic materials mentioned above as examples of the material for the partition walls 14. In addition, for easy wetting and spreading of inks at the time of forming the organic light emitting layers 17 as upper layers, it is preferable that the surfaces of the pixel restricting layers 141 have a liophilic property for the inks.

(5) Hole Injection Layer

The hole injection layer 15 is provided over the pixel electrode 13 for the purpose of accelerating the injection of holes from the pixel electrode 13 into the organic light emitting layer 17. The hole injection layers 15 are layers of, for example, an oxide of Ag (silver), Mo (molybdenum), Cr (chromium), V (vanadium), W (tungsten), Ni (nickel), Ir (iridium) or the like, or a conductive polymer material such as PEDOT (a mixture of polythiophene and polystyrenesulfonic acid). The hole injection layers 15 may be formed by, for example, a sputtering process or a wet process.

Of the above-mentioned, the hole injection layers 15 including an oxidized metal have a great work function, and stably inject holes into the organic light emitting layers 17.

(6) Hole Transport Layer

The hole transport layer 16 has a function of transporting the holes, injected from the hole injection layer 15, to the organic light emitting layer 17. The hole transport layers 16 are formed, for example, by a wet process using a material which is a polyolefin or its derivative or a polyarylamine or its derivative or the like and which does not have a hydrophilic group.

(7) Organic Light Emitting Layer

The organic light emitting layers 17 are formed in openings 14a, and have functions of emitting light in colors of R, G and B, through recombination of holes and electrons. Note that particularly when it is necessary to make a description while specifying the light emission color, the organic light emitting layers 17 will be referred to as organic light emitting layers 17(R), 17(G) and 17(B), respectively.

As materials for the organic light emitting layers 17, known materials can be used. Specific examples of the material to be preferably used here include fluorescent substances such as oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compound, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, complexes of Schiff base and Group III metals, oxine metal complexes, and rare earth complexes.

(8) First Functional Layer

The first functional layer 18 has functions of restraining movement of moisture from the underlying organic layer into the second functional layer 19, and transporting electrons from the counter electrode 20 to the organic light emitting layers 17. The first functional layer 18 includes NaF (sodium fluoride). NaF is excellent in electron injecting property, with a reducing material vapor deposited as an overlying layer, and is low in moisture permeability, so that it has a water-proof property.

(9) Second Functional layer 19

The second functional layer 19 has a function of injecting or transporting electrons, supplied from the counter electrode 20, to the organic light emitting layer 17 side. The second functional layer 19 is formed using an organic material, particularly, an electron-transporting organic material doped with Yb (ytterbium).

Note that examples of the electron-transporting organic material (host material) include π-electron low molecular weight organic materials such as oxadiazole derivatives (OXD), triazole derivatives (TAZ), and phenanthroline derivatives (BCP, Bphen), which are nonlimitative.

(10) Counter Electrode

The counter electrode 20 includes a transparent conductive material, and is formed over the second functional layer 19. The counter electrode 20 functions as a cathode.

As the counter electrode 20, there can be used, for example, a metallic thin film or a transparent conductive film such as ITO and IZO. For obtaining an optical resonator structure more effectively, it is desirable to form a metallic thin film of at least one material selected from among aluminum, magnesium, silver, aluminum-lithium alloy, magnesium-silver alloy and the like, as the material of the counter electrode 20. The thickness of the metallic thin film is desirably 5 to 30 nm.

In the case of adopting the above-mentioned optical resonator structure, it is desirable to adjust the optical distance between the organic light emitting layer 17 and the counter electrode 20 to a suitable magnitude, by forming a transparent conductive film of ITO or IZO or the like in a desired thickness between the second functional layer 19 and the counter electrode 20 (for the details, see modification (2) described later).

In addition, a transparent conductive film of ITO or IZO or the like may be similarly formed over the counter electrode 20, such as to adjust chromaticity and viewing angle.

(11) Sealing Layer

The sealing layer 21 is provided for preventing the organic layers such as the hole transport layers 16, the organic light emitting layers 17 and the second functional layer 19 from being deteriorated due to exposure to moisture or air.

The sealing layer 21 is formed by using a light transmitting material such as silicon nitride (SiN) and silicon oxynitride (SiON), for example.

(12) Others

Though not depicted in FIG. 3, an anti-glare polarizing plate or an upper substrate may be adhered onto the sealing layer 21 through a transparent adhesive. In addition, color filters for correcting chromaticity of light emitted by each of the organic EL elements 2 may be adhered. By these members, it is possible to further protect the hole transport layers 16, the organic light emitting layers 17, the second functional layers 19 and the like from external moisture, air and the like.

3. Method of Manufacturing Organic EL Panel 10

A method of manufacturing the organic EL panel 10 will be described below, referring to the drawings.

FIGS. 4A to 4E, FIGS. 5A to 5D, FIGS. 6A and 6B, and FIGS. 7A to 7D are schematic sectional views depicting the states in steps in manufacturing the organic EL panel 10. Besides, FIG. 8 is a flow chart depicting the manufacturing steps of the organic EL panel 10.

(1) Substrate Preparing Step

Figure 4A:
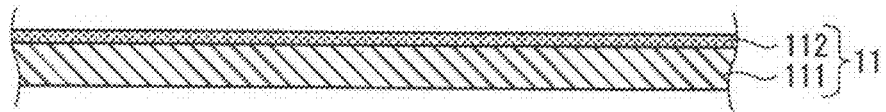
FIGS. 4A to 4E are partial sectional views schematically depicting a manufacturing process of an organic EL element.
Figure 8:
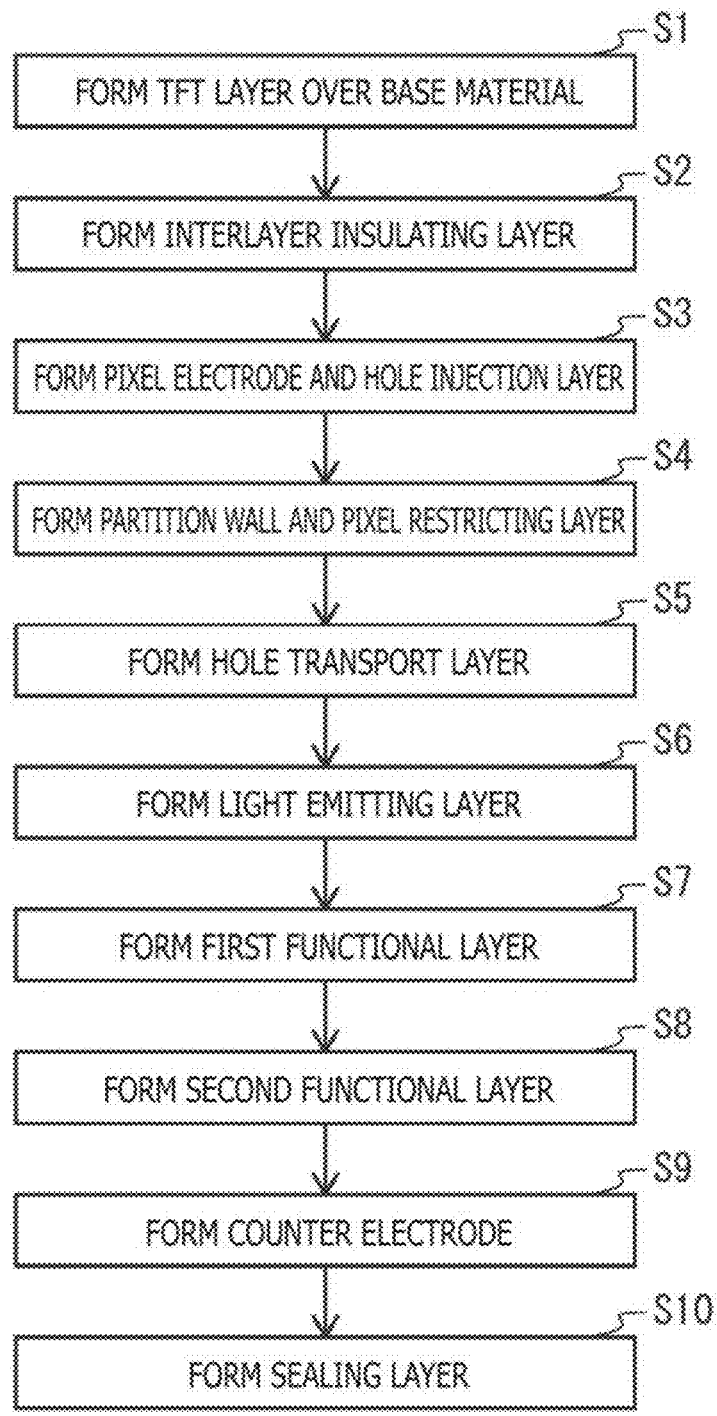
FIG. 8 is a flow chart depicting the manufacturing process of the organic EL element.

First, as illustrated in FIG. 4A, the TFT layer 112 is formed over the base material 111, to prepare the substrate 11 (step S1 in FIG. 8). The TFT layer 112 can be formed by a known TFT producing method.

(2) Interlayer Insulating Layer Forming Step

Figure 4B:
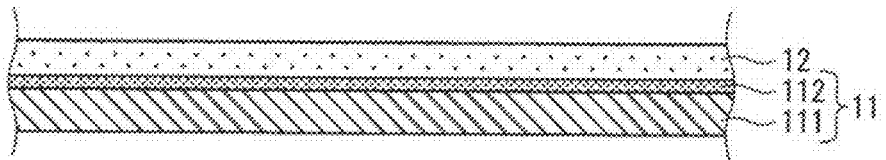

Next, as depicted in FIG. 4B, the interlayer insulating layer 12 is formed over the substrate 11 (step S2 in FIG. 8).

Specifically, a resin material having a predetermined flowing property is applied along the upper surface of the substrate 11 in such a manner as to bury the ruggedness (projections and recesses) formed on the substrate 11 due to the TFT layer 112, by a die coating method, for example. As a result, the upper surface of the interlayer insulating layer 12 is shaped to be flat along the upper surface of the base material 111.

In addition, a dry etching method is applied to those parts of the interlayer insulating layer 12 which are located over, for example, source electrodes of TFT elements, to form the contact holes (not illustrated). The contact holes are formed, by patterning or the like, in such a manner that the surfaces of the source electrodes are exposed at bottom portions thereof.

Subsequently, connection electrode layers are formed along inner walls of the contact holes. Of upper portions of the connection electrode layers, parts are disposed over the interlayer insulating layer 12. The connection electrode layers can be formed by using, for example, a sputtering method; specifically, after a metallic film is formed, patterning may be conducted using a photolithography method and a wet etching method.

(3) Pixel Electrode and Hole Injection Layer Forming Step

Figure 4C:
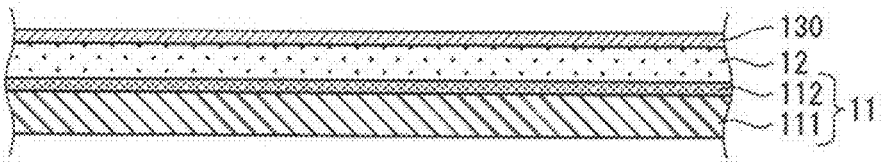

Next, as illustrated in FIG. 4C, a pixel electrode material layer 130 is formed over the interlayer insulating layer 12. The pixel electrode material layer 130 can be formed by using, for example, a vacuum deposition method, a sputtering method or the like.

Figure 4D:
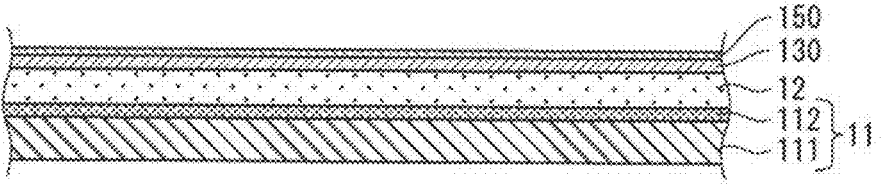

Further, a hole injection material layer 150 is formed over the pixel electrode material layer 130 (FIG. 4D). The hole injection material layer 150 can be formed by using, for example, a reactive sputtering method or the like.

Figure 4E:
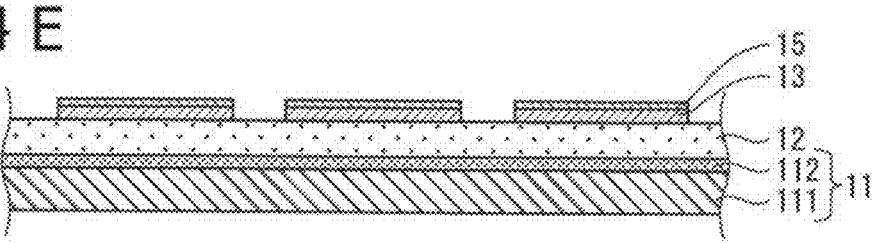

Then, as depicted in FIG. 4E, the pixel electrode material layer 130 and the hole injection material layer 150 are patterned by etching, to form pluralities of pixel electrodes 13 and hole injection layers 15 partitioned on a sub-pixel basis (step S3 in FIG. 8).

Note that the method for forming the pixel electrodes 13 and the hole injection layers 15 is not limited to the aforementioned method. For example, the pixel electrode material layer 130 may be patterned to form the pixel electrodes 13, after which the hole injection layers 15 may be formed.

In addition, the hole injection layers 15 may be formed by a wet process, after the partition walls 14 are formed.

(4) Partition Wall and Pixel Restricting Layer Forming Step

Subsequently, the partition walls 14 and the pixel restricting layers 141 are formed (step S4 in FIG. 8).

In the present embodiment, the pixel restricting layers 141 and the partition walls 14 are formed in separate steps.

(4-1) Pixel Restricting Layer Formation

First, in order to partition the pixel electrode columns in the Y direction (FIG. 2) on a sub-pixel basis, the pixel restricting layers 141 extending in the X direction are formed.

Figure 5A:
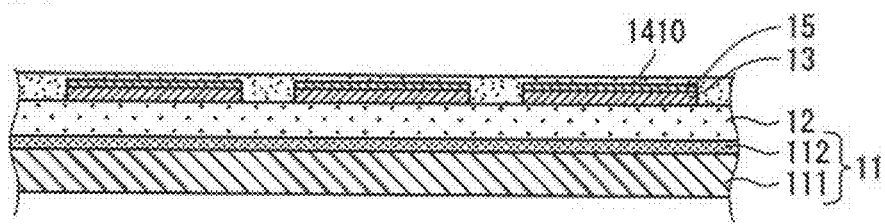
FIGS. 5A to 5D are partial sectional views schematically depicting the manufacturing process of the organic EL element subsequent to FIGS. 4A to 4E.

As depicted in FIG. 5A, a photosensitive resin material as a material for the pixel restricting layers 141 is uniformly applied over the interlayer insulating layer 12 formed with the pixel electrodes 13 and the hole injection layers 15, to form a pixel restricting layer material layer 1410 having a film thickness equal to the height of the pixel restricting layers 141 to be formed.

As a specific coating (applying) method, there can be used, for example, a wet process such as a die coating method and a spin coating method. After the coating (application), it is preferable to perform, for example, vacuum drying and low-temperature heating drying (pre-baking) at approximately 60° C. to 120° C. to remove the unrequired solvent, thereby fixing the pixel restricting layer material layer 1410 to the interlayer insulating layer 12.

Then, the pixel restricting layer material layer 1410 is patterned by use of a photolithography method.

For example, in the case where the pixel restricting layer material layer 1410 has a positive-type photosensitive property, the pixel restricting layer material layer 1410 is exposed to light through a photomask (not illustrated) which shields light in areas where the layer 1410 is to be left as the pixel restricting layers 141 and which is transparent in areas where the layer 1410 is to be removed.

Next, development is conducted to remove the exposed regions of the pixel restricting layer material layer 1410, whereby the pixel restricting layers 141 can be formed. A specific developing method may include, for example, immersing the substrate 11 as a whole in a developing liquid such as an organic solvent or an alkaline liquid for dissolving the exposed parts of the pixel restricting layer material layer 1410, followed by cleaning the substrate 11 with a rinsing liquid such as pure water.

Figure 5B:
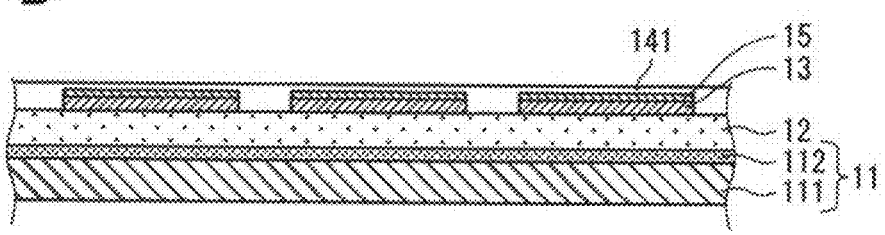

Thereafter, baking (post-baking) is conducted at a predetermined temperature, whereby the pixel restricting layers 141 extending in the X direction can be formed over the interlayer insulating layer 12 (FIG. 5B).

(4-2) Partition Wall Formation

Subsequently, the partition walls 14 extending in the Y direction are formed similarly to the pixel restricting layers 141.

Figure 5C:
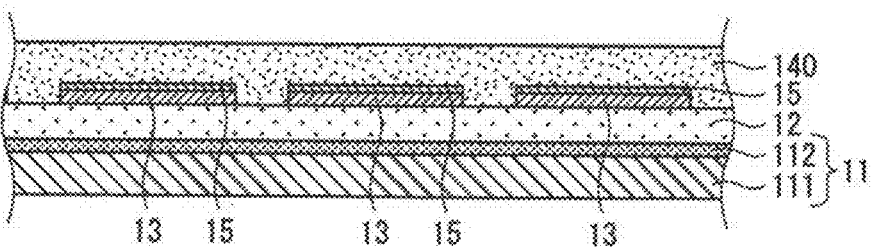
Figure 5D:
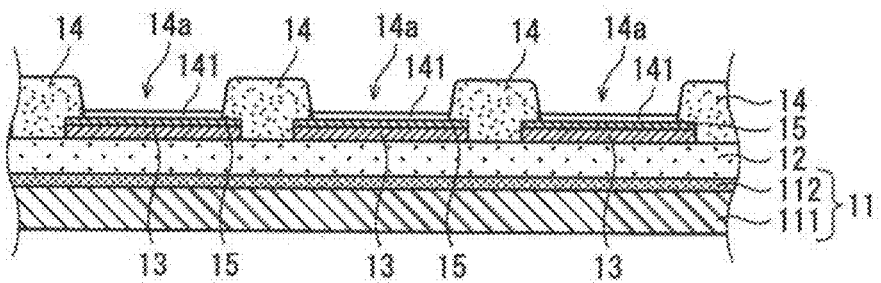

Specifically, a resin material for the partition walls is applied over the interlayer insulating layer 12 formed with the pixel electrodes 13, the hole injection layers 15 and the pixel restricting layers 141, by use of a die coating method or the like, to form a partition wall material layer 140 having a film thickness equal to the height of the partition walls 14 to be formed (FIG. 5C), then the partition walls 14 extending in the Y direction are patterned in the partition wall material layer 140 by a photolithography method, and thereafter baking is conducted at a predetermined temperature to form the partition walls 14 (FIG. 5D).

Note that while patterning is conducted after the respective material layers of the pixel restricting layers 141 and the partition walls 14 are formed by a wet process in the foregoing, one or both of the material layers may be formed by a dry process and then patterning may be performed by a photolithography method and an etching method.

(5) Hole Transport Layer Forming Step

Figure 6A:
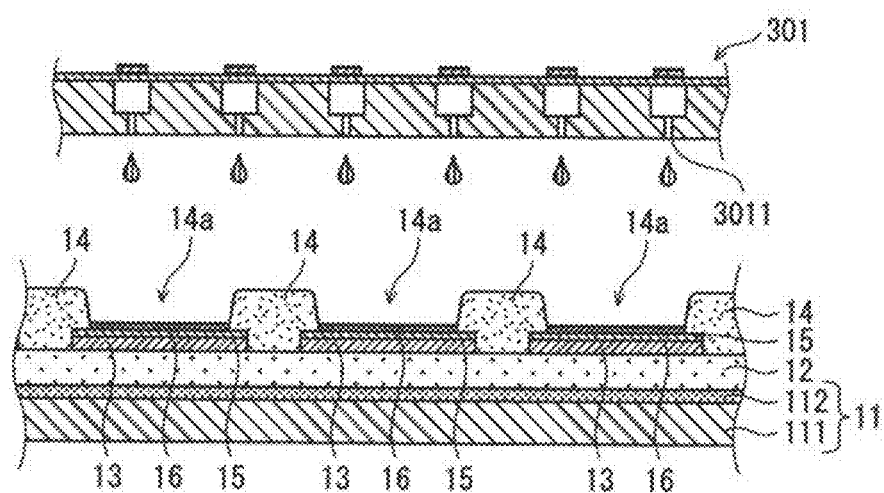
FIGS. 6A and 6B are partial sectional views schematically depicting the manufacturing process of the organic EL element subsequent to FIGS. 5A to 5D.

Next, as depicted in FIG. 6A, an ink containing a constituent material of the hole transport layers 16 is ejected from nozzles 3011 of a coating (applying) head 301 of a printing device toward the openings 14a defined by the partition walls 14, to apply the ink onto the hole injection layers 15 in the openings 14a. In this instance, the ink for the hole transport layers 16 is applied in such a manner as to extend in the Y direction (FIG. 2) on an upper side of the pixel electrode columns. Thereafter, the ink is dried, to form the hole transport layers 16 (step S5 in FIG. 8).

(6) Organic Light Emitting Layer Forming Step

Subsequently, the organic light emitting layers 17 are formed on an upper side of the hole transport layers 16 (step S6 in FIG. 8).

Figure 6B:
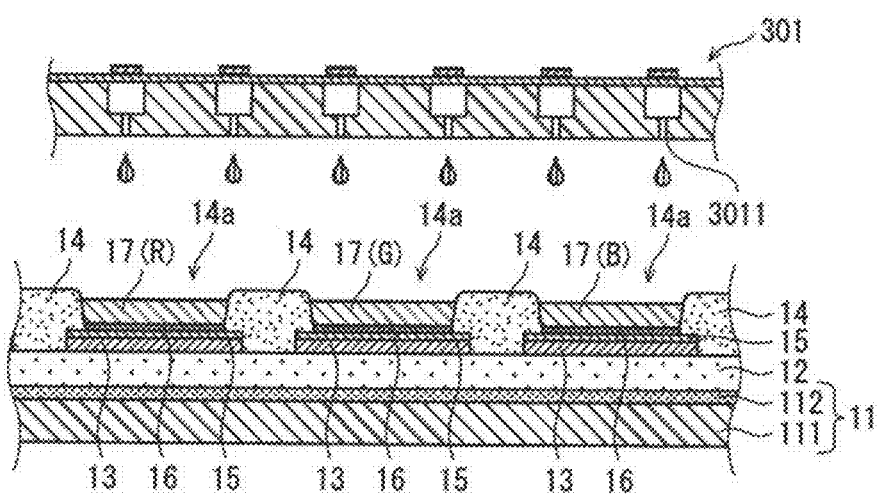

Specifically, as depicted in FIG. 6B, the inks containing light emitting materials for light emission colors corresponding to the openings 14a are sequentially ejected from the nozzles 3011 of the coating (applying) head 301 of the printing device, to apply the inks onto the hole transport layers 16 in the openings 14a. In this instance, the inks are applied in such a manner as to be continuous on the upper side of the pixel restricting layers 141. As a result, the inks can flow in the Y direction, so that unevenness in application of the inks can be reduced, and the film thickness of the organic light emitting layers 17 in the same sub-pixel column can be uniformized.

Then, the substrate 11 after the ink application is carried into a vacuum drying chamber and is heated in a vacuum environment, to evaporate off the organic solvents in the inks. By this, the organic light emitting layers 17 can be formed.

(7) First Functional Layer Forming Step

Figure 7A:
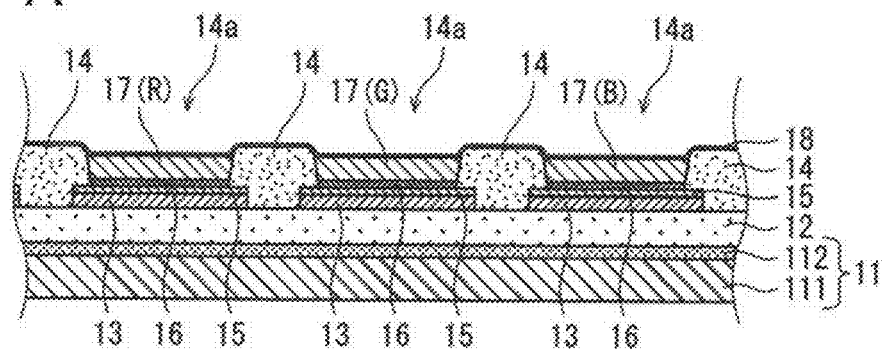
FIGS. 7A to 7D are partial sectional views schematically depicting the manufacturing process of the organic EL element subsequent to FIGS. 6A and 6B.

Next, as depicted in FIG. 7A, the first functional layer 18 is formed over the organic light emitting layers 17 and the partition walls 14 (step S7 in FIG. 8). The first functional layer 18 is formed by forming a film of NaF in common for sub-pixels by a vapor deposition method.

(8) Second Functional Layer Forming Step

Figure 7B:
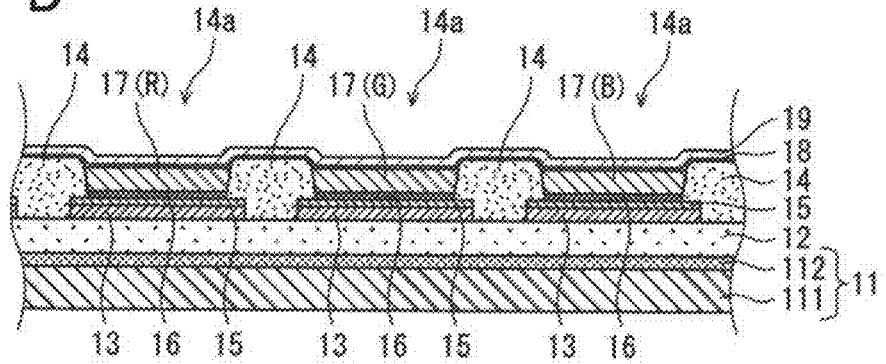

Subsequently, as depicted in FIG. 7B, the second functional layer 19 is formed over the first functional layer 18 (step S8 in FIG. 8). The second functional layer 19 is formed, for example, by forming a film of an electron-transporting organic material and Yb as a doping metal in common for the sub-pixels by a vapor co-deposition method.

(9) Counter Electrode Forming Step

Figure 7C:
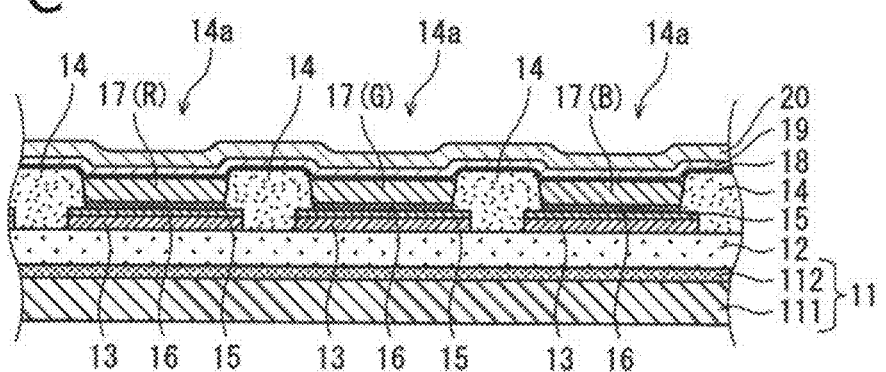

Next, as depicted in FIG. 7C, the counter electrode 20 is formed over the second functional layer 19 (step S9 in FIG. 8). In the present embodiment, the counter electrode 20 is formed by forming a film of silver, aluminum or the like by a sputtering method of a vacuum deposition method.

(10) Sealing Layer Forming Step

Figure 7D:
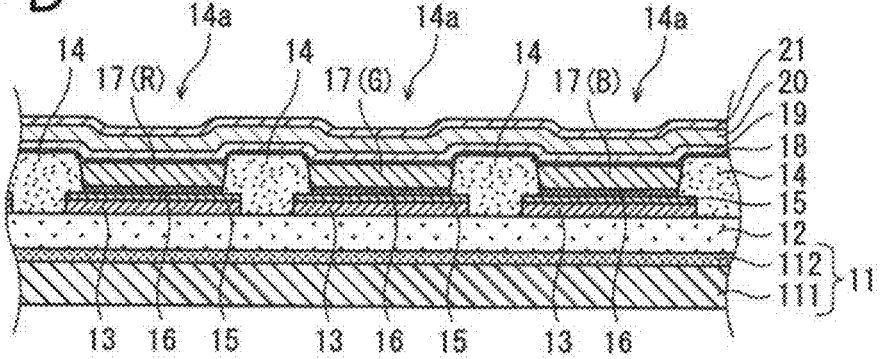

Subsequently, as illustrated in FIG. 7D, the sealing layer 21 is formed over the counter electrode 20 (step S10 in FIG. 8). The sealing layer 21 can be formed by forming a film of SiON, SiN or the like by a sputtering method, a CVD (chemical vapor deposition) method or the like.

By these steps, the organic EL panel 10 is completed.

Note that the above-mentioned manufacturing method is merely an example, and various modifications are possible.

4. Evaluation Experiment of Organic EL Element

Next, evaluation experiments were conducted with respect to luminous efficiency and life of the organic EL element 2 formed by the present embodiment.

Figure 9:
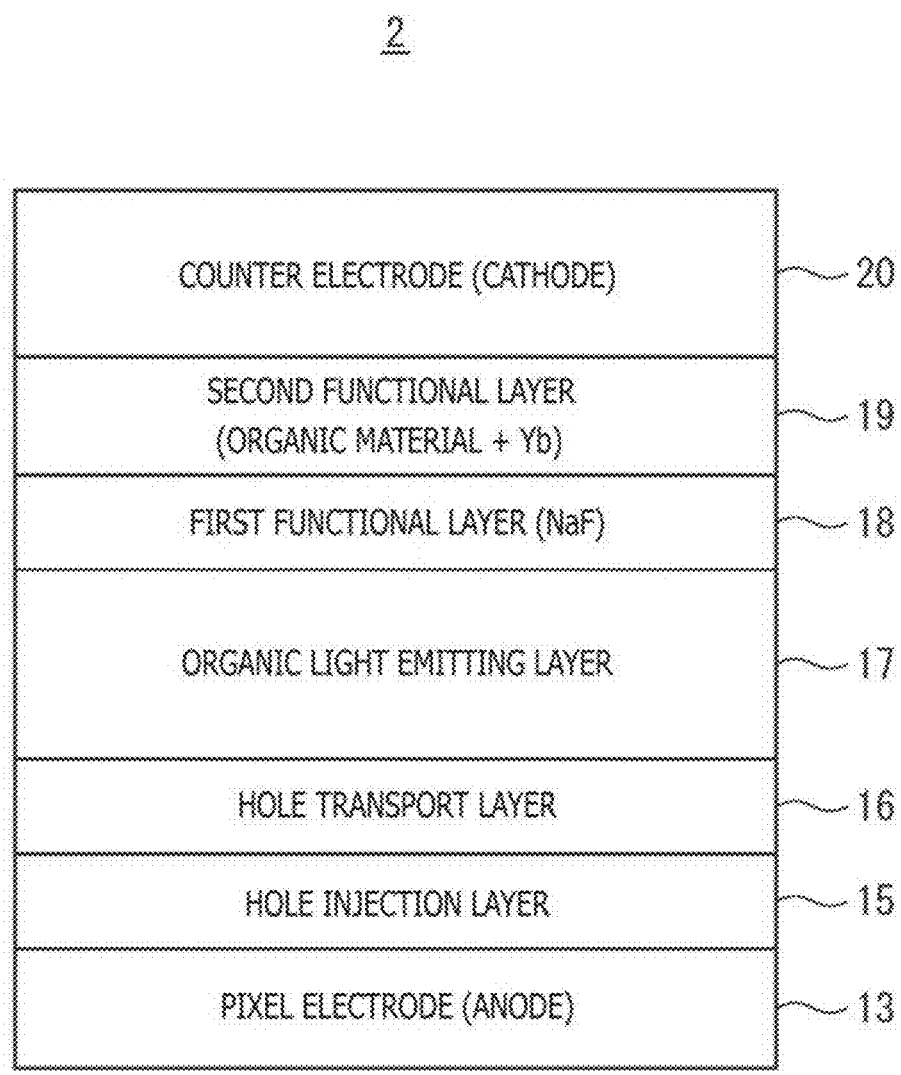
FIG. 9 is a figure schematically depicting a stacked structure of the organic EL element according to a mode of the present disclosure.

FIG. 9 is a figure schematically depicting a stacked structure ranging from the pixel electrode (anode) 13 to the counter electrode (cathode) 20 in the above-mentioned organic EL element 2.

In the organic EL element 2 (working example product) as an experiment target, an Al alloy was vapor deposited on a glass substrate to form pixel electrodes (anodes) 13, and the hole injection layers 15, the electron transport layer 16, the organic light emitting layers 17, the first functional layer 18, the second functional layer 19 and the counter electrode (cathode) 20 were sequentially stacked.

The first functional layer 18 is an NaF thin film having a thickness of 2 nm, and was formed by a vacuum deposition method. The second functional layer 19 was formed by co-depositing an organic material and Yb in a film thickness of 15 nm by a vapor co-deposition method. The doping concentration of the doping metal Yb is 20 wt %.

In an organic EL element according to comparative example product 1, the first functional layer 18 in FIG. 9 was not formed, and the doping metal in the second functional layer 19 was Ba. Ba is an alkaline earth metal, is sufficiently low in work function, and has been widely used as an n-type dopant in the related art.

In an organic EL element according to comparative example product 2, the first functional layer 18 in FIG. 9 was not formed, and the doping metal in the second functional layer 19 was Yb.

In an organic EL element according to comparative example product 3, the first functional layer 18 including NaF was formed, and the doping metal in the second functional layer 19 was Ba.

The film thickness of the second functional layer and the doping concentration of the doping metal in the comparative example products 1 to 3 were set respectively to 15 nm and 20 wt %, the same as those for the working example product.

In addition, the film thickness of the first functional layer 18 in the comparative example product 3 was 2 nm, the same as that for the working example product.

The other layer forming conditions were all the same for the working example product and the comparative example products 1 to 3.

FIG. 10 is a comparison table in which the results of luminous efficiency, driving voltage, life and total evaluation for the working example product and the comparative example products 1 to 3 are set forth.

In the table, in the luminous efficiency column, the luminous efficiency (total light flux per unit electric power 1 m/W (lumens per watt)) at the initial stage of light emission is set forth, in terms of relative value in the case where the luminous efficiency of the working example product is taken as 100.

In addition, in the driving voltage column, the reciprocal of the driving voltage when a predetermined current is applied is set forth, in terms of relative value in the case where the driving voltage of the working example product is taken as 100. Since the reciprocals of the driving voltage are compared, a higher numerical value in this column represents a lower driving voltage.

In the life column, the results of an accelerated experiment are set forth; here, for example, the life end is determined to be reached when the luminous efficiency is lowered to or below 80% of the initial value. In this case, also, the life is set forth in terms of relative value in the case where the life of the working example product is taken as 100.

Note that in the total evaluation, the case where the luminous efficiency, driving voltage, and life were not less than 95 points was evaluated as "A," the case where they are not less than 80 points and less than 95 points was evaluated as "B," and the case where they were less than 80 points was evaluated as "C."

As seen from the comparison table in FIG. 10, in the comparative example products 1 and 2 lacking the first functional layer, the luminous efficiency was lowered to approximately 60% of that of the working example product. Besides, the driving voltage was largely raised in the comparative example products 1 and 2. Moreover, as for evaluation of life, it was lowered to approximately to 30% in the comparative example product 1 in which the doping metal in the second functional layer was Ba, and was lowered to approximately 50% in the comparative example product 2 in which the doping metal was Yb.

In addition, in the comparative example product 3, the doping metal in the second functional layer was Ba, and the first functional layer including NaF was provided. In this case, therefore, the electron transporting property is complemented, and evaluation values of luminous efficiency and driving voltage are high, but they are slightly inferior to those of the working example product. However, in regard of life, there is still a difference of no less than 30 points between the comparative example product 3 and the working example product.

Only the working example product got a total evaluation of "A."

From such experimental results, the followings are seen.

(a) Although the work function of Ba is lower than the work function of Yb (the work function of Ba is 2.52 V, and the work function of Yb is 2.6 V), evaluations of luminous efficiency and driving voltage are slightly higher in the case where the doping metal is Yb than the case where the doping metal is Ba. It is considered that Yb as a rare earth metal is lower in activity, and is less liable to be altered in quality through reaction with moisture in the light emitting device manufacturing process, than Ba as an alkaline earth metal, is lower in voltage, and is restrained from lowering in electron current amount, whereby a lowering in efficiency is also restrained.

(b) Since Yb as a rare earth metal is lower in activity and is less liable to be altered in quality through reaction with moisture than Ba as an alkaline earth metal, the product in which the doping metal is Yb is much advantageous from the viewpoint of life.

(c) In the cases where the first functional layer is absent (comparative example product 1, comparative example product 2), whether the doping metal in the second functional layer is Ba or Yb produced a life difference of 18%. However, in the cases where the first functional layer including NaF is present (comparative example product 3, working example product), whether the doping metal in the second functional layer is Ba or Yb produced a life difference of no less than 30%. It is conjectured that the combination of NaF and Yb is good in compatibility, and, due to the synergistic effect of NaF and Yb, an organic EL element superior in resistance to moisture and having a long life is formed.

5. In Regard of Film Thicknesses of First Functional Layer and Second Functional Layer and Doping Concentration in Second Functional Layer (1) Film Thickness of First Functional Layer NaF for forming the first functional layer 18 has an electron injecting property for electron injection into the organic light emitting layer 17 and a moisture-blocking property as aforementioned, and the film thickness thereof is desirably 0.1 to 20 nm. If the film thickness is less than 0.1 nm, the layer is too thin to sufficiently exhibit the effect of the electron injecting property for injection of electrons from the second functional layer 19 into the organic light emitting layer 17 and the moisture-blocking property for the second functional layer 19. On the other hand, if the film thickness exceeds 20 nm, the reducing action of the second functional layer would not act on the first functional layer sufficiently, and the electron injecting property would be worsened.

(2) Film Thickness of Second Functional Layer

Yb as a doping metal in the second functional layer 19 is excellent in the electron injecting property for injection of electrons from the counter electrode 20 as cathode, and higher in transparency as compared to Ba used in the related art and the like; accordingly, the film thickness of the second functional layer 19 can be in the range from 5 to 150 nm. If the film thickness is less than 5 nm, the layer is too thin to sufficiently reduce NaF constituting the first functional layer and to sufficiently inject electrons from the cathode. On the other hand, if the film thickness exceeds 150 nm, optical adjustment is difficult to accomplish, light extraction efficiency may be worsened, and a problem as to luminous efficiency may be generated.

Since the film thickness of the second functional layer 19 can be set within such a wide range, it is possible, by an optical design, to set the thickness of the second functional layer 19 individually on the basis of each of light emission colors of R, G and B within the film thickness range, thereby building up an optical resonator structure.

Note that the first functional layer 18 is simultaneously in charge of both a function of blocking movement of moisture from the underlying organic layer into the second functional layer 19 and a function of injection of electrons into the organic light emitting layers 17. Therefore, it is effective to stack the first functional layer 18 directly on the organic light emitting layers 17, and to form the second functional layer 19 directly on the first functional layer 18. This eliminates the need for intermediately providing a surplus intermediate layer, and, therefore, can reduce process load.

(3) Doping Concentration of Yb in Second Functional Layer

Yb is low in work function, is excellent in electron injecting property, and is much lower than alkali metals and the like in reactivity with moisture. Therefore, the doping concentration of Yb can be set within the range from 1 to 90 wt %. If the doping concentration is less than 1 wt %, it is difficult to obtain the predetermined electron injecting property. On the other hand, if the doping concentration exceeds 90 wt %, lumps of Yb are liable to be generated at the time of vapor deposition or the like, and it is difficult to evenly disperse Yb in the organic layer of the host material.

6. Effects (Summary)

As has been described above, in the organic EL element according to the modes of the present disclosure, the first functional layer 18 including NaF is formed over the organic light emitting layers 17, and the second functional layer 19 doped with Yb is formed thereover.

NaF of the first functional layer 18 is high in moisture-blocking ability, and the electron injecting property can be increased by the reducing action of Yb. Therefore, it is possible for NaF to restrain penetration of moisture from the underlying organic light emitting layers 17 and the organic layers of the partition walls 14 and the pixel restricting layers 141 into the second functional layer 19, while exhibiting the function of the electron transport layer.

On the other hand, Yb as the doping metal in the second functional layer 19 is a rare earth metal, and is low in work function. Therefore, electron injecting property is good, luminous efficiency is enhanced, and driving voltage can be suppressed. Further, penetration of moisture from the underlying organic layers is restrained by the first functional layer 18, and, moreover, Yb itself is lower in reactivity with moisture, and is less liable to be altered in quality, than alkali metals and the like.

Therefore, it is possible to restrain deterioration of electron injecting property of the second functional layer 19 due to moisture contained in the organic layers and to realize a prolonged life of the organic EL element, while reducing the manufacturing cost by forming at least one of the organic layers of the organic EL element 2 by a wet process.

<<Modifications>>

While embodiments of the organic EL element, the organic EL panel, the method of manufacturing an organic EL element, and so on have been described above as modes of the present disclosure, the present disclosure is not limited in any way by the above descriptions, except for essential characteristic components thereof. Other modes of the present disclosure will be described below.

(1) Modifications of Configuration of Second Functional Layer

While the second functional layer 19 has been a single layer and the doping concentration of Yb therein has been uniform in the above embodiment, the following configurations may also be adopted.

Figure 11:
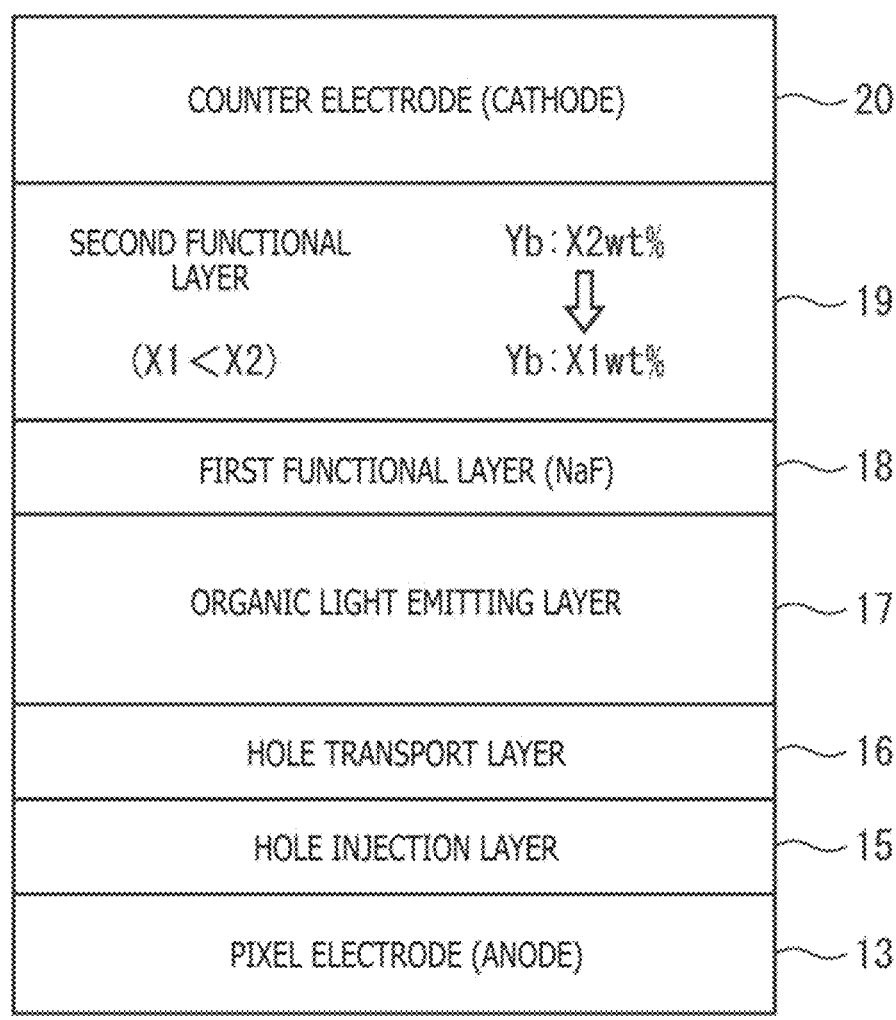
FIG. 11 is a schematic view depicting a stacked structure according to a first modification of a second functional layer of an organic EL element.

(1-1) Configuration in which Second Functional Layer is of Single-Layer Structure with Yb Concentration Gradient in Film Thickness Direction FIG. 11 is a schematic view depicting a stacked structure of an organic EL element 2 according to a first modification.

As depicted in the figure, the doping concentration of Yb in the second functional layer 19 is X2 wt % on the side of contact with the counter electrode 20, and is gradually decreased in going toward the first functional layer 18, to be X1 wt % ($1 \leq X1 < X2 \leq 90$) at the part in contact with the first functional layer 18.

Such a configuration ensures that by continuously varying the Yb content of the second functional layer, it is possible, while exhibiting a water-proof property as to NaF of the first functional layer, to cause a weak reducing property to act on the first functional layer, to further restrain penetration of moisture into the second functional layer though limiting an electron injecting property, and to prevent light transmittance from being lowered more than necessary due to an increase in Yb doping amount. In addition, by setting the Yb concentration high on the cathode side, it is possible to enhance the electron injecting property from the cathode side into the second functional layer, to inhibit penetration of moisture from the exterior, and to further prolong the life of the organic EL element.

As a result, it is possible to provide an organic EL element having a further enhanced luminous efficiency and capable of realizing a prolonged life.

Note that as a method for gradually varying the Yb doping concentration, for example, in a vapor co-deposition method, the temperature of an electric furnace for heating Yb and the temperature of an electric furnace for heating the organic material may be individually controlled such that the vapor deposition rate of Yb is gradually slowed down relative to the vapor deposition rate of the organic material.

(1-2) Second Functional Layer is of Two-Layer Structure

Figure 12:
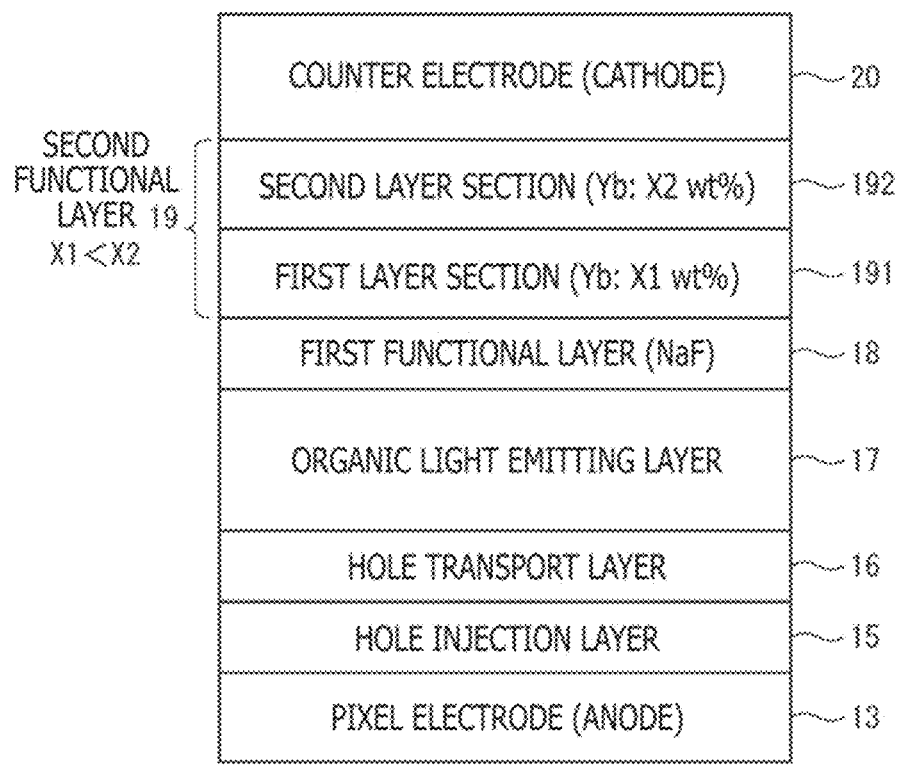
FIG. 12 is a schematic view depicting a stacked structure according to a second modification of the second functional layer of the organic EL element.

FIG. 12 is a schematic view depicting a stacked structure of an organic EL element 2 according to a second modification.

As depicted in the figure, the second functional layer 19 is of a two-layer structure including a first layer section 191 and a second layer section 192, and the Yb doping concentration (X2 wt %) in the second layer section 192 is set to be higher than the Yb doping concentration (X1 wt %) of the first layer section 191 ($1 \leq X1 < X2 \leq 90$).

According to the present modification, an enhanced luminous efficiency and a prolonged life can be expected, like in the above modification (1-1).

(1-3) Second Functional Layer is of Three-Layer Structure

Figure 13:
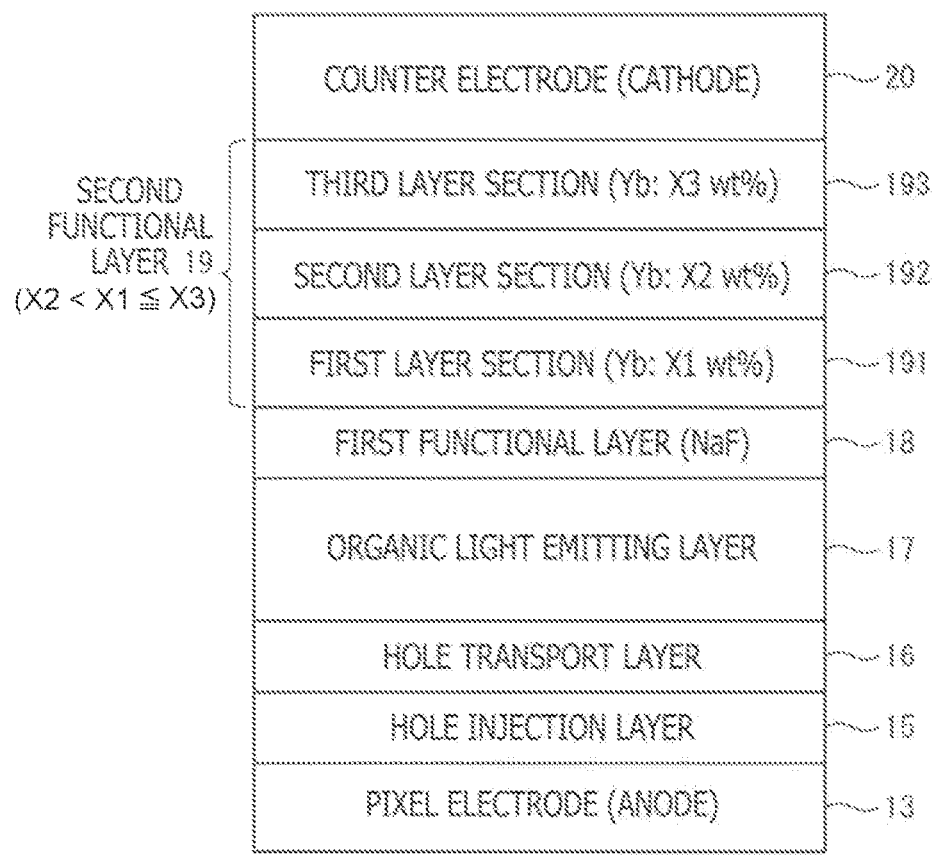
FIG. 13 a schematic view depicting a stacked structure according to a third modification of the second functional layer of the organic EL element.

FIG. 13 is a schematic view depicting a stacked structure of an organic EL element 2 according to a second modification.

As depicted in the figure, the second functional layer 19 is of a three-layer structure including a first layer section 191, a second layer section 192 and a third layer section 193, and a relation of $1 \leq X2 < X1 \leq X3 \leq 90$ is satisfied, where X1 wt %, X2 wt % and X3 wt % are the Yb doping concentrations in the first to third layer sections 191 to 193.

According to the present modification, the doping concentration in the third layer section 193 on the counter electrode 20 side is greater than that in the first layer section 191 on the first functional layer 18 side, and, therefore, an effect similar to that in the second modification can be obtained in this point. In addition, the doping concentration in the second layer section 192 located between the first and third layer sections 191 and 193 is set to be the lowest, and, therefore, it is possible to prevent light transmittance from being lowered more than necessary due to the increase in the Yb doping amount.

In addition, it is possible, while exhibiting a water-proof property as to NaF of the first functional layer, to reduce NaF and to enhance electron injecting property into the light emitting layer.

Besides, by setting the Yb concentration in the third layer section high, it is possible to enhance electron injecting property from the cathode side into the second functional layer, to inhibit penetration of moisture from the exterior, and to obtain an effect to further prolong the life of the organic EL element.

(2) Optical Resonator Structure

For further enhancement of luminous efficiency, it is desirable to adopt an optical resonator structure.

Figure 14:
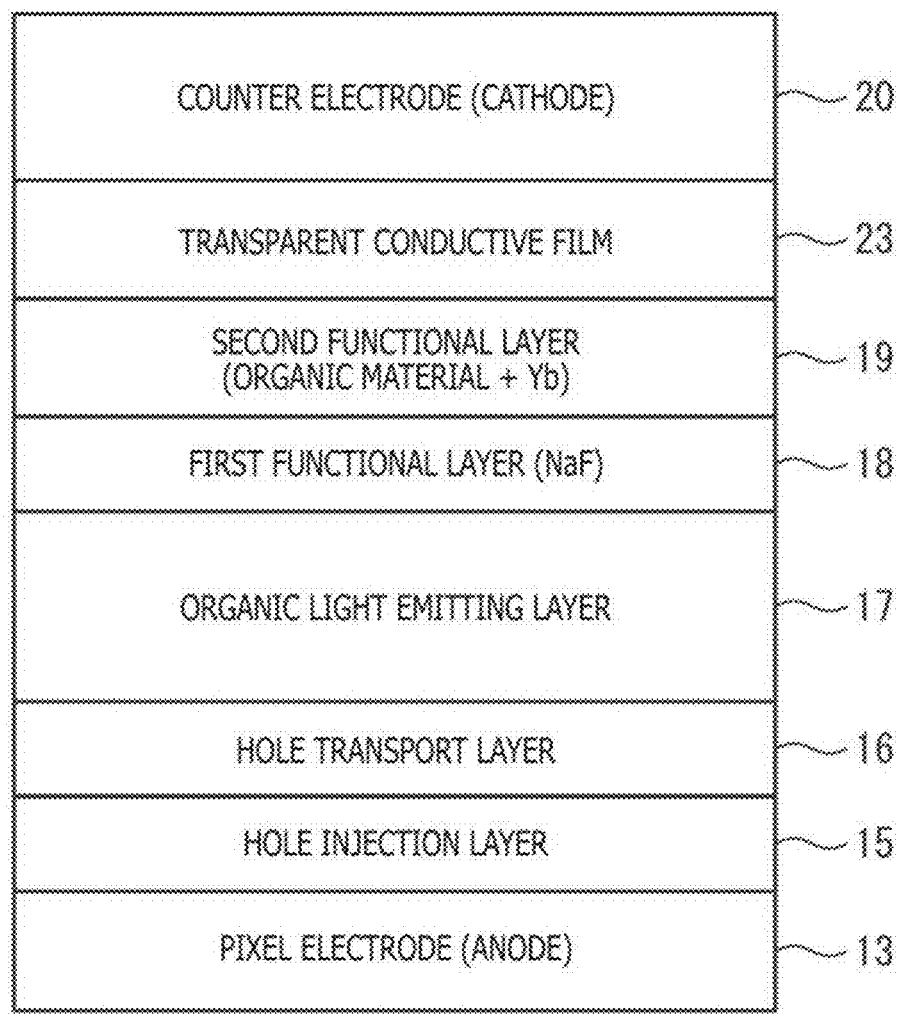
FIG. 14 is a schematic view depicting a stacked structure according to a further modification of the organic EL element.

FIG. 14 is a schematic view depicting a stacked structure according to another mode of the organic EL element 2.

As depicted in the figure, a transparent conductive film 23 having a predetermined thickness is formed between the second functional layer 19 and the counter electrode 20. This transparent conductive film 23 is formed by, for example, magnetron sputtering of ITO or IZO.

With the transparent conductive film 23 thus interposed, the set of the counter electrode 20 and the transparent conductive film 23 functions as a cathode, and the combined sheet resistance is lowered, which contributes to prevention of lowering in luminance due to a voltage drop. In addition, since ITO and IZO are high in transparency, the thickness of the transparent conductive film 23 can be comparatively large, so that the film can be utilized for adjustment of optical lengths in the optical resonator structure.

The thickness of the transparent conductive film 23 is desirably not less than 15 nm, and more desirably not less than 40 nm. With the thickness of the transparent conductive film set to be not less than 15 nm, cavity adjustment (film thickness adjustment for the optical resonator structure) can be utilized effectively, and an enhanced efficiency can be realized.

Figure 15:
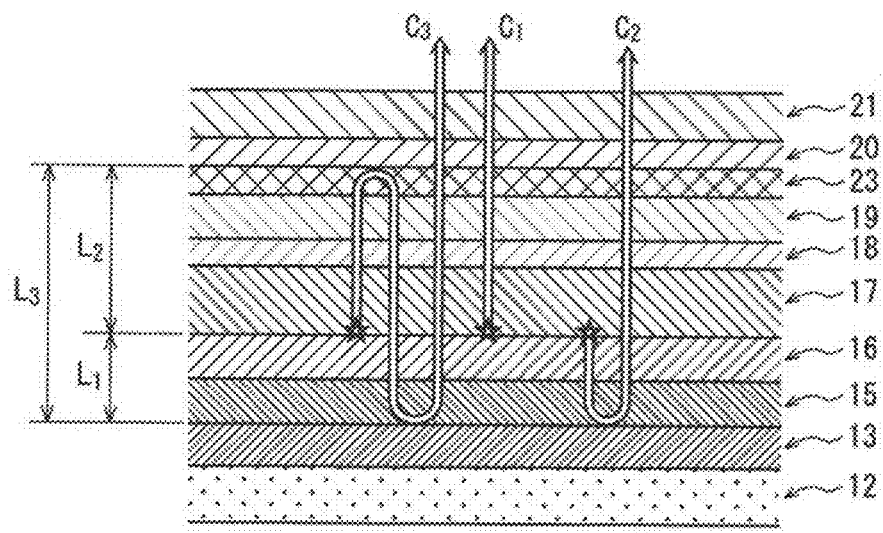
FIG. 15 is a schematic figure for explaining an optical resonator structure.

FIG. 15 is a figure for explaining interference of light in an optical resonator structure in the organic EL element 2 according to the present modification.

The optical resonator structure is configured between the interface between the pixel electrode 13 and the hole injection layer 15 and the interface between the counter electrode 20 and the transparent conductive film 23.

FIG. 15 depicts main optical paths of light going out from the organic light emitting layer 17. An optical path C1 is an optical path along which the light going out from the organic light emitting layer 17 toward the counter electrode 20 side is transmitted through the counter electrode 20 without being reflected.

An optical path C2 is an optical path along which the light going out from the organic light emitting layer 17 toward the pixel electrode 13 is reflected by the pixel electrode 13, and is transmitted through the organic light emitting layer 17 and transmitted through the counter electrode 20. In this case, it is desirable for the counter electrode 20 to have a semi-transmitting property such as to reflect part of the light coming from the lower side. Such a counter electrode 20 can be achieved by forming, for example, a film of Ag, Al or an alloy thereof in a film thickness of approximately 5 to 30 nm by a vapor deposition method as described above.

An optical path C3 is an optical path along which the light going out from the organic light emitting layer 17 toward the counter electrode 20 side is reflected by the counter electrode 20, is further reflected by the pixel electrode 13, and is transmitted through the organic light emitting layer 17 and transmitted through the counter electrode 20.

The optical distance difference (optical path difference) $\Delta C1$ between the optical path C1 and the optical path C2 corresponds to the length of two times an optical film thickness L1 depicted in FIG. 15. The optical film thickness L1 is the total optical path (the sum total of the products of film thickness and refractive index of the layers) of the hole injection layer 15 and the hole transport layer 16, in the range from the organic light emitting layer 17 to the interface of the pixel electrode 13 with the hole injection layer 15.

In addition, the optical distance difference $\Delta C2$ between the optical path C2 and the optical path C3 corresponds to two times an optical film thickness L2 depicted in FIG. 15. The optical film thickness L2 is the optical distance (the sum total of the products of film thickness and refractive index of the layers) of the first functional layer 18, the second functional layer 19 and the transparent conductive film 23, in the range from the organic light emitting layer 17 to the interface of the counter electrode 20 with the transparent conductive film 23.

In an optical resonator structure, it is necessary to make such an adjustment that the respective lights transmitted along the optical path C1, the optical path C2 and the optical path C3 go out from the organic EL element 2 with the same phase. Therefore, let a target wavelength of the light emitted in FIG. 15 be $\lambda$, then, since reflection occurs once in the optical path C2 to produce a shift of a half wavelength, it is desirable that:

Optical path difference $\Delta C1$=(integer times of $\lambda$)+$\lambda/2$.

In this way, one or two of the values of the film thicknesses of the hole injection layer 15, the hole transport layer 16 and the organic light emitting layer 17 and the like are set.

In addition, it is necessary to make such an adjustment that the light transmitted along the optical path C3 goes out from the organic EL element 2 with the same phase. For this purpose, since reflection occurs twice in the optical path C3, it is desirable that Optical path difference $\Delta C2$=integer times of $\lambda$.

Besides, while the optical path difference $\Delta C1$ is determined by the thicknesses and refractive indexes of the hole injection layer 15 and the hole transport layer 16, it is desirable that the optical path difference $\Delta C2$ is adjusted by the thickness and refractive index of the transparent conductive film 23 depicted in FIG. 14. Since the transparent conductive film 23 is high in transparency as aforementioned, a little difference in the thickness of this thin film produces little influence.

Since the wavelengths of the light emission colors are different, the film thicknesses of the hole injection layers 15, the hole transport layers 16 and the organic light emitting layers 17 and the thickness of the transparent conductive films 23 in the organic EL elements 2 corresponding to the light emission colors are determined such as to change the optical path differences $\Delta C1$ and $\Delta C2$ according to the wavelengths.

Note that since Yb is less liable to be altered in quality through reaction with moisture as aforementioned, the doping amount of Yb in the second functional layer 19 can be minimized; as a result, transparency is high, and the permitted range of film thickness is wide, and, therefore, the film thickness may be set such that the optical path difference $\Delta C2$, in place of the transparent conductive film 23 or together with the transparent conductive film 23, satisfies the above-mentioned resonation condition.

In addition, also when a film of ITO or IZO is formed as a third functional layer over the second functional layer 19 by a sputtering method, the second functional layer 19 can mitigate the sputter damage, so that the organic light emitting layers are protected, and it is possible to obtain an organic EL element of which luminous efficiency is good and life is not shortened.

(3) Inhibition of Penetration of Moisture from Exterior and Alleviation of Voltage Drop due to Sheet Resistance of Counter Electrode (3-1)

Figure 16:
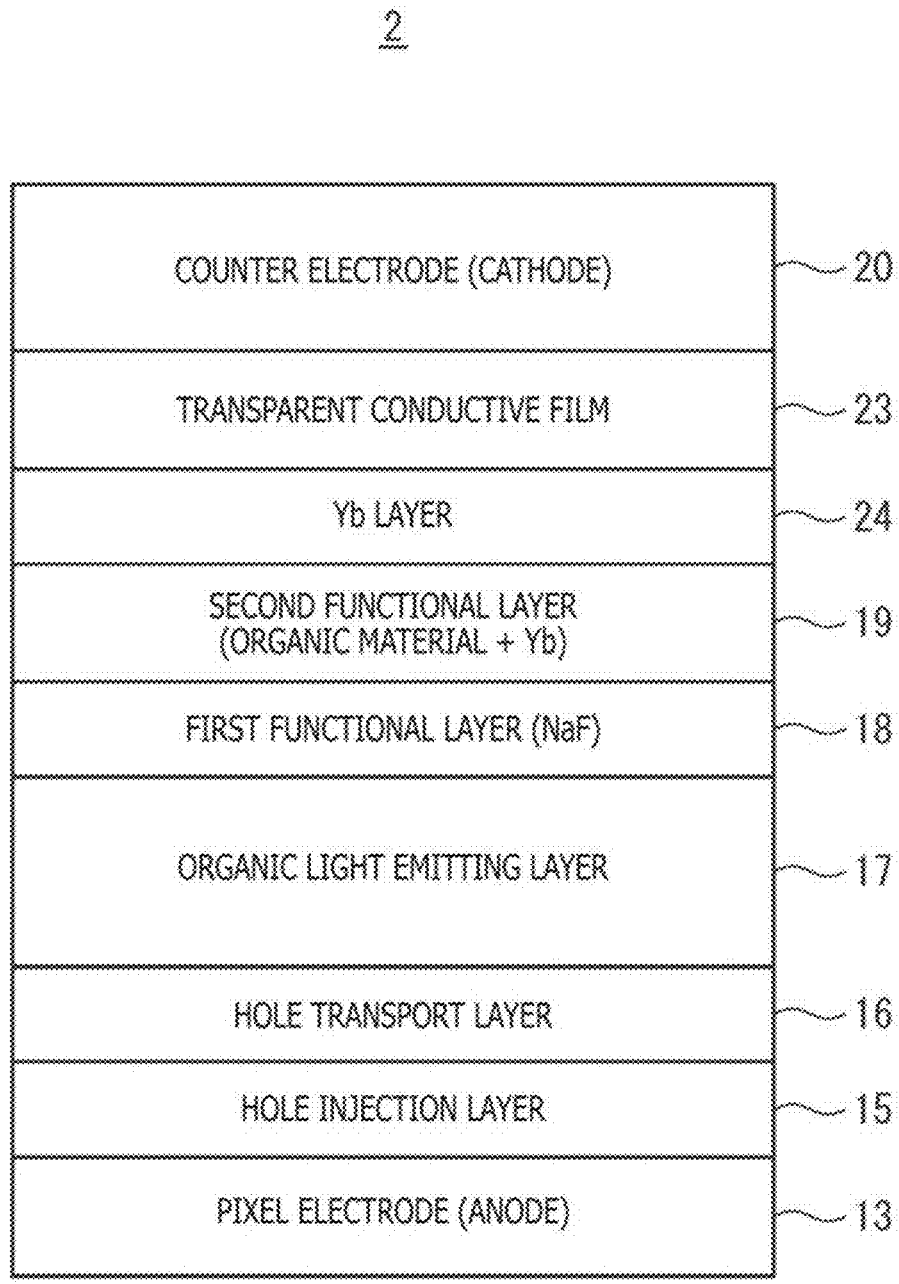
FIG. 16 is a schematic view depicting a stacked structure according to a further modification of the organic EL element.

FIG. 16 is a schematic view depicting a stacked structure according to a further mode of the organic EL element 2.

This is different from the configuration of FIG. 14 in that an intermediate layer (Yb layer) 24 including Yb is formed between the second functional layer 19 and the transparent conductive film 23.

By this, electron injecting property from the counter electrode 20 is further enhanced. In addition, when the Yb layer 24, the transparent conductive layer 23 and the counter electrode 20 are regarded as a set of cathode, the overall sheet resistance is lowered. Therefore, even when the organic EL panel 10 is enlarged in size, the voltage drop in a central portion of the screen is restrained, and a better image quality can be obtained.

Further, since Yb has water resistance to some extent, it is possible to inhibit penetration of moisture from the upper layers (the transparent conductive layer 23, the counter electrode 20, the sealing layer 21), to restrain deterioration of the lower layers such as the second functional layer 19 and the organic light emitting layers 17, and to realize a prolonged life.

Note that the film thickness of the Yb layer 24 is desirably in the range of 0.1 to 3 nm.

If the film thickness is less than 0.1 nm, water resistance and the effect to lower the sheet resistance are not expected so much. If the film thickness exceeds 3 nm, on the other hand, it influences light transmittance, and may rather lower the luminous efficiency of the organic EL element 2.

(3-2)

Figure 17:
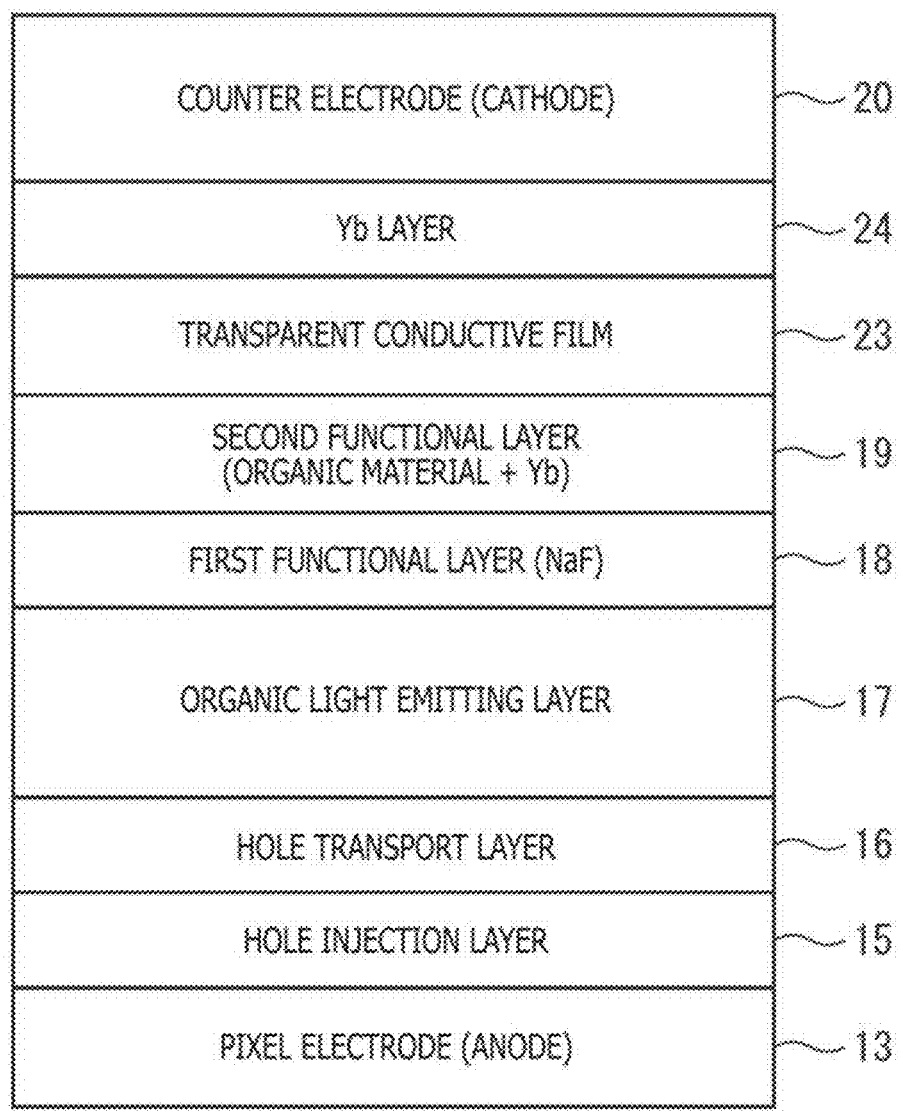
FIG. 17 is a schematic view depicting a stacked structure according to a further modification of the organic EL element.

FIG. 17 is a schematic view depicting a stacked structure according to yet another mode of the organic EL element 2.

As depicted in the figure, in the present modification, the Yb layer 24 is formed between the transparent conductive film 23 and the counter electrode 20. According to this configuration, also, sheet resistance of a set of the counter electrode 20 and the Yb layer 24 is lowered, so that voltage drop is alleviated, and, even when the organic EL panel 10 is enlarged in size, the voltage drop in a central portion of the screen is restrained, and a better image quality can be obtained.

In addition, by water resistance of Yb, it is possible to inhibit penetration of moisture from the upper layers (the counter electrode 20, the sealing layer 21), to restrain deterioration of the lower layers such as the transparent conductive film 23, the second functional layer 19 and the organic light emitting layers 17, and to realize a prolonged life. According to this configuration, the transparent conductive film 23 can also be protected from external moisture.

Note that the film thickness of the Yb layer 24 in the present modification is also desirably in the range of 0.1 to 3 nm, for the reason similar to that in the above (3-1).

(3-3)

Figure 18:
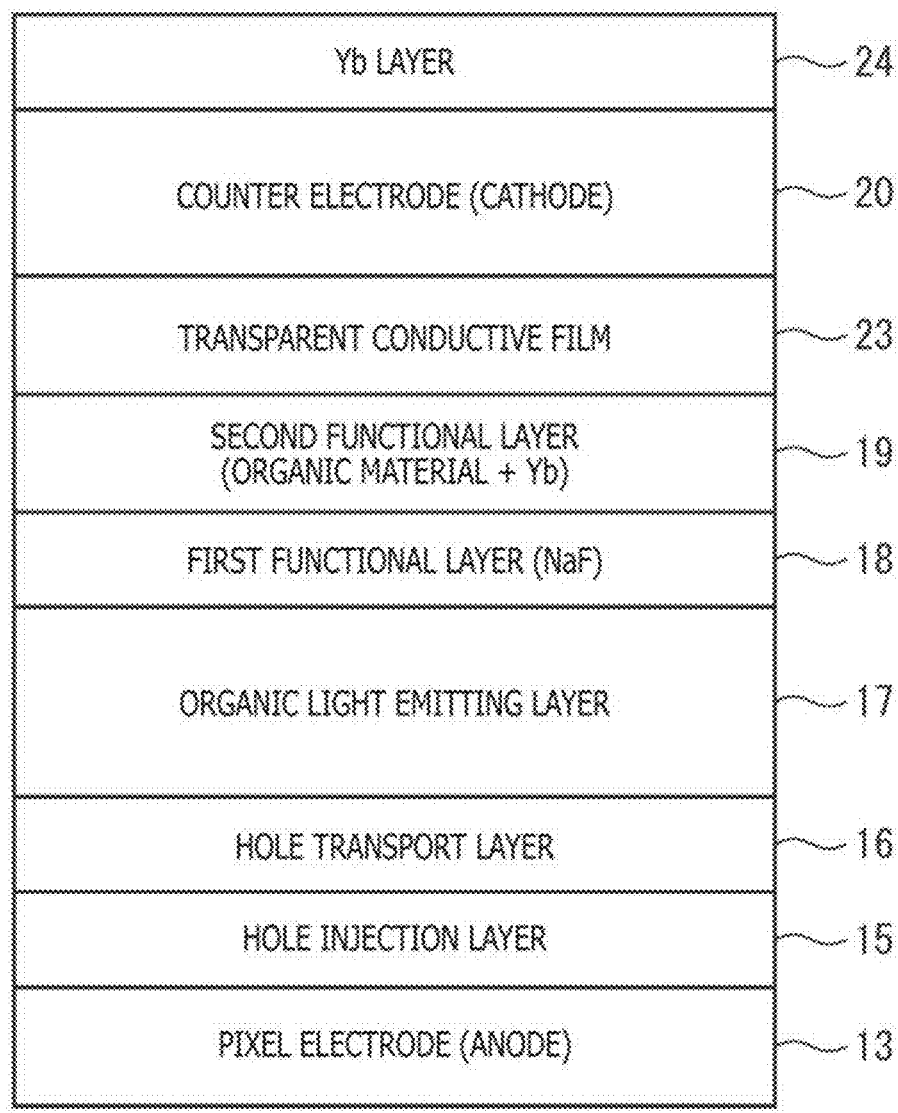
FIG. 18 is a schematic view depicting a stacked structure according to a further modification of the organic EL element.

FIG. 18 is a schematic view depicting a stacked structure according to a yet further mode of the organic EL element 2. As depicted in the figure, in the present modification, the Yb layer 24 is formed on the outer side (the opposite side from the organic light emitting layer 17) of the counter electrode 20. According to this configuration, also, the voltage drop due to sheet resistance of the counter electrode 20 is alleviated, and, even when the organic EL panel 10 is enlarged in size, the voltage drop in a central portion of the screen is restrained, and a better image quality can be obtained. It is to be noted, however, that since the Yb layer 24 is provided on the outer side of the counter electrode 20, the effect to reinforce electron injecting property is not obtained.

In addition, by water resistance of Yb, it is possible to inhibit penetration of moisture from the upper layer (the sealing layer 21), to restrain deterioration of the lower layers such as the transparent conductive film 23, the second functional layer 19 and the organic light emitting layer 17, and to realize a prolonged life.

The film thickness of the Yb layer 24 in the present modification is desirably in the range of 0.1 to 5 nm. If the film thickness is less than 0.1 nm, water resistance and the effect to lower the sheet resistance are not expected so much. On the other hand, if the film thickness exceeds 5 nm, it influences light transmittance, and may rather lower the luminous efficiency of the organic EL element 2.

(4) Modification of Partition Wall and Pixel Restricting Layer Forming Step

While the partition walls 14 and the pixel restricting layers 141 have been formed in separate steps in the above embodiment, the partition walls 14 and the pixel restricting layers 141 may be formed simultaneously by use of a halftone mask.

First, a resin material is applied over the interlayer insulating layer 12 formed with the pixel electrode 13 and the hole injection layers 15 by a wet process such as die coating method, to form the partition wall material layer 140 (see FIG. 5C).

After the application (coating), it is preferable, for example, to perform vacuum drying and low-temperature heating drying (pre-baking) at approximately 60° C. to 120° C. to remove unrequired solvent, and to fix the partition wall material layer to the interlayer insulating layer 12.

Next, the partition wall material layer 140 is exposed to light through a photomask (not illustrated).

For example, in the case where the partition wall material layer 140 has a positive-type photosensitive property, light is shielded at parts where to leave the partition wall material layer 140, and the parts to be removed are exposed.

The pixel restricting layers 141 are smaller than the partition walls 14 in film thickness, and, therefore, the partition wall material layer 140 should be half-exposed in areas of the pixel restricting layers 141.

Therefore, the photomask to be used for the exposure step is a halftone mask including: a light-shielding part which is disposed at positions corresponding to the partition walls 14 and which perfectly shields light; a semi-transparent part which is disposed at positions corresponding to the pixel restricting layers 141; and a transparent part which is disposed at positions corresponding to other exposed portions of the pixel electrodes 13.

The transparency (transmittance) of the semi-transparent part is determined in such a manner that upon exposure for a predetermined time, the partition wall material layer 140 over the pixel electrodes 13 is fully exposed, while the pixel restricting layers 141 are left in amounts corresponding to the height thereof, without being exposed.

Next, development is conducted to remove the exposed regions of the partition wall material layer 140, whereby the partition walls 14 and the pixel restricting layers 141 smaller than the partition walls 14 in film thickness can be formed. A specific developing method may include, for example, immersing the substrate 11 as a whole in a developing liquid such as an organic solvent or an alkaline liquid for dissolving those parts of the partition wall material layer 140 which have been exposed, and washing the substrate 11 with a rinsing liquid such as pure water. Thereafter, baking is conducted at a predetermined temperature.

By using the halftone mask as above-mentioned, the partition walls 14 extending in the Y direction and the pixel restricting layers 141 extending in the X direction can be formed over the interlayer insulating layer 12 by the same step, and the number of steps can be reduced accordingly, which contributes to a reduction in the organic EL panel manufacturing cost.

(5) Modification of Stacked Structure of Organic EL Element

In the above embodiment, the stacked configuration of the organic EL element has included the first functional layer 18, the second functional layer 19, the hole injection layer 15 and the hole transport layer 16, but this configuration is not limitative. For example, the organic EL element does not have the hole transport layer 16. In addition, for example, a hole injection/transport layer as a single layer may be provided in place of the hole injection layer 15 and the hole transport layer 16.

(6)

In the organic EL panel 10 according to the above embodiment, as illustrated in FIG. 2, the extending direction of the pixel restricting layers 141 has been the long axis X direction of the organic EL panel 10, and the extending direction of the partition walls 14 has been the short axis Y direction of the organic EL panel 10. However, these directions may be inverted. In addition, the extending directions of the pixel restricting layers and the partition walls may be independent of the shape of the organic EL panel 10.

In addition, while the image display surface has been rectangular as an example in the organic EL panel 10 according to the above embodiment, the shape of the image display surface is not limited, and can be modified as required.

Besides, while the pixel electrodes 13 have been rectangular flat plate-shaped members in the organic EL panel 10 according to the above embodiment, this is not restrictive.

Further, while the organic EL panel of the line bank system has been described in the above embodiment, the organic EL panel may be of a so-called pixel bank system in which each sub-pixel is surrounded by partition walls on four sides thereof.

(7)

While the sub-pixels 100R, 100G and 100B that emit light respectively in R, G and B colors have been arranged in the organic EL panel 10 according to the above embodiment, the light emission colors of the sub-pixels are not limited to these; for example, four colors including yellow (Y) in addition to R, G and B may be adopted. In addition, in one pixel P, the number of sub-pixels per color is not limited to one, and a plurality of sub-pixels may be arranged per color. Besides, the arrangement of the sub-pixels in the pixel P is not limited to the order of red color, green color and blue color, as depicted in FIG. 2, but may be in other order.

(8)

In addition, while the active matrix system has been adopted for the organic EL panel 10 according to the above embodiment, this is not limitative, and a passive matrix system may also be adopted. Besides, the present disclosure is applicable not only to a top emission type organic EL display panel but also to a bottom emission type organic EL display panel.

(9)

Figure 19:
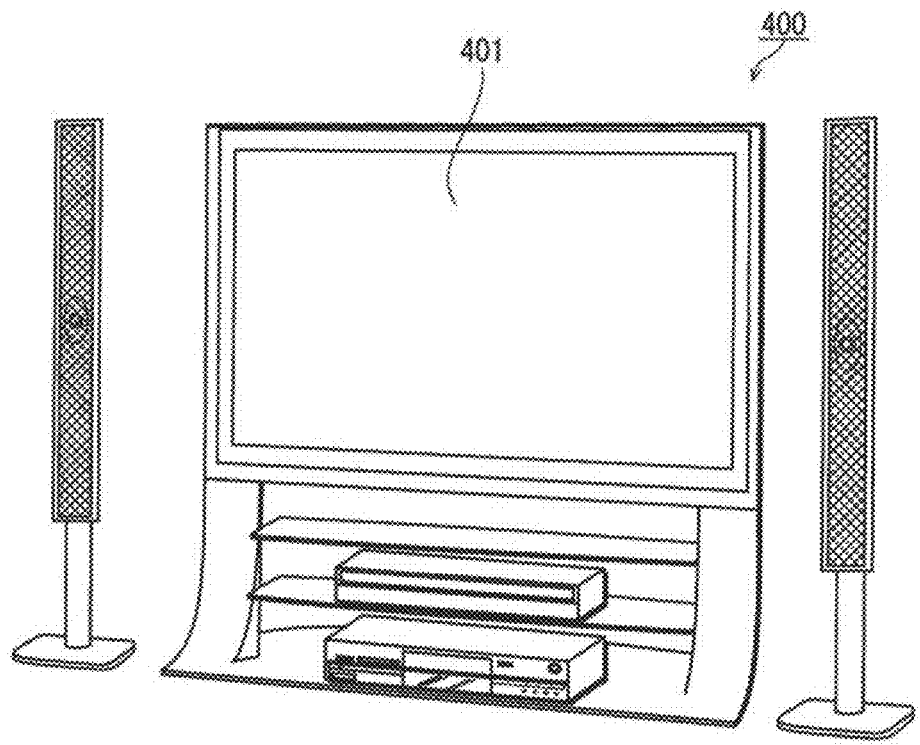
FIG. 19 is a figure depicting an example of a television device as an electronic apparatus on which the organic EL display device according to the mode of the present disclosure is mounted.

The organic EL panel according to the above embodiment can be used as a display panel for a display section 401 of a television device 400 as depicted in FIG. 19, and for other various electronic apparatuses such as personal computers, portable terminals, and displays for business use.

<<Supplement>>

While the organic EL element, the method of manufacturing the same, the organic EL panel, the organic EL display device and the electronic apparatus according to the present disclosure have been described above based on the embodiment and modifications, the present disclosure is not limited to the above embodiment and modifications. Modes obtained by applying various modifications conceived by those skilled in the art to the above embodiment and modifications, and modes realized by arbitrarily combining the components and functions of the above embodiment and modifications within the scope of the gist of the present disclosure, are also embraced by the present disclosure.

The organic EL element according to the present disclosure can be widely utilized for display panels to be used in various electronic apparatuses.

What is claimed is:

1. An organic electroluminescence element comprising:
an anode;
an organic light emitting layer disposed on an upper side of the anode;
a first functional layer disposed over the organic light emitting layer and including NaF;
a second functional layer disposed over the first functional layer and including an organic material containing Yb; and
a cathode disposed on an upper side of the second functional layer,
wherein the second functional layer includes a first layer section, a second layer section and a third layer section that are sequentially stacked in this order from a first functional layer side, and a relation of $X2<X1<X3$ is satisfied, where X1, X2 and X3 are Yb contents of the first layer section, the second layer section and the third layer section, respectively.

2. The organic electroluminescence element according to claim 1,
wherein the first functional layer has a film thickness of 0.1 to 20 nm.

3. The organic electroluminescence element according to claim 1,
wherein the second functional layer has a film thickness of 5 to 150 nm.

4. The organic electroluminescence element according to claim 1,
wherein a transparent conductive film is formed as a third functional layer between the second functional layer and the cathode.

5. The organic electroluminescence element according to claim 4,
wherein the third functional layer has a film thickness of not less than 15 nm.

6. The organic electroluminescence element according to claim 4,
wherein a thin film including Yb and having a thickness of 0.1 to 3 nm is formed between the second functional layer and the third functional layer.

7. The organic electroluminescence element according to claim 4,
wherein a thin film including Yb and having a thickness of 0.1 to 3 nm is formed between the third functional layer and the cathode.

8. The organic electroluminescence element according to claim 1,
wherein a thin film including Yb and having a thickness of 0.1 to 5 nm is formed on an opposite side of the cathode from the organic light emitting layer.

9. The organic electroluminescence element according to claim 1,
wherein the anode has a light reflecting property, and the cathode has a semi-transparent property.

10. The organic electroluminescence element according to claim 9, wherein light emitted from the organic light emitting layer includes a first light flux going out directly from the cathode and a second light flux going out from the cathode after being reflected by respective surfaces on an organic light emitting layer side of the anode and the cathode, and a film thickness of at least one functional layer interposed in a range from the organic light emitting layer to the cathode is set according to a wavelength of a color in which the light is emitted in such a manner that the first light flux and the second light flux resonate.

11. An organic electroluminescence element comprising:
an anode;
an organic light emitting layer disposed on an upper side of the anode;
a first functional layer disposed over the organic light emitting layer and including NaF;
a second functional layer disposed over the first functional layer and including an organic material containing Yb; and
a cathode disposed on an upper side of the second functional layer,
wherein the second functional layer includes a first layer section disposed over the first functional layer, and a second layer section disposed over the first layer section, and
Yb content of the second layer section is greater than Yb content of the first layer section.

12. An organic electroluminescence element comprising:
an anode;
an organic light emitting layer disposed on an upper side of the anode;
a first functional layer disposed over the organic light emitting layer and including NaF;
a second functional layer disposed over the first functional layer and including an organic material containing Yb; and
a cathode disposed on an upper side of the second functional layer,
wherein Yb content of the second functional layer increases continuously in going from the first functional layer toward the cathode.

13. An electronic apparatus comprising:
an organic electroluminescence display device as an image display section, the organic electroluminescence display device including
an organic electroluminescence panel in which a plurality of organic electroluminescence elements are arranged in a matrix pattern on an upper side of a substrate, the plurality of organic electroluminescence elements each including an anode, an organic light emitting layer disposed on an upper side of the anode, a first functional layer disposed over the organic light emitting layer and including NaF, a second functional layer disposed over the first functional layer and including an organic material containing Yb, and a cathode disposed on an upper side of the second functional layer, and the organic light emitting layers in at least the organic electroluminescence elements adjacent to each other in a row direction are partitioned from each other by a partition wall extending in a column direction, and
a driving section driving the organic electroluminescence panel to display an image,
wherein the second functional layer includes a first layer section, a second layer section and a third layer section that are sequentially stacked in this order from a first functional layer side, and a relation of $X2<X1<X3$ is satisfied, where $X1$, $X2$ and $X3$ are Yb contents of the first layer section, the second layer section and the third layer section, respectively.

* * * * *